(12) United States Patent
Park et al.

(10) Patent No.: US 10,971,648 B2
(45) Date of Patent: Apr. 6, 2021

(54) ULTRAVIOLET LIGHT-EMITTING ELEMENT AND LIGHT-EMITTING ELEMENT PACKAGE

(71) Applicant: LG INNOTEK CO., LTD., Seoul (KR)

(72) Inventors: Chan Keun Park, Seoul (KR); Sul Hee Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 500 days.

(21) Appl. No.: 15/774,562

(22) PCT Filed: Nov. 9, 2016

(86) PCT No.: PCT/KR2016/012852
§ 371 (c)(1),
(2) Date: May 8, 2018

(87) PCT Pub. No.: WO2017/082622
PCT Pub. Date: May 18, 2017

(65) Prior Publication Data
US 2020/0259042 A1    Aug. 13, 2020

(30) Foreign Application Priority Data

Nov. 9, 2015   (KR) .................. 10-2015-0156638

(51) Int. Cl.
*H01L 33/32*     (2010.01)
*H01L 33/00*     (2010.01)
*H01L 33/40*     (2010.01)

(52) U.S. Cl.
CPC .......... *H01L 33/0025* (2013.01); *H01L 33/32* (2013.01); *H01L 33/405* (2013.01)

(58) Field of Classification Search
CPC combination set(s) only.
See application file for complete search history.

(56) References Cited

U.S. PATENT DOCUMENTS 7,479,661 B2    1/2009  Lee et al.
8,039,869 B2 *  10/2011 Lester ................. H01L 33/0093
                                                              257/190
(Continued)

FOREIGN PATENT DOCUMENTS

CN    103280497    9/2013
CN    103378240    10/2013
(Continued)

OTHER PUBLICATIONS

International Search Report (with English Translation) and Written Opinion dated Feb. 24, 2017 issued in Application No. PCT/KR2016/012852.

(Continued)

*Primary Examiner* — Ratisha Mehta
*Assistant Examiner* — Md M Islam
(74) *Attorney, Agent, or Firm* — KED & Associates LLP

(57) ABSTRACT

An embodiment relates to an ultraviolet light-emitting device, a method for manufacturing the ultraviolet light-emitting element, a light-emitting element package, and a lighting device. An ultraviolet light-emitting element according to an embodiment includes: a first conductive type first semiconductor layer having a light extraction structure; an etching-blocking layer on the first conductive type first semiconductor layer; a first conductive type second semiconductor layer on the etching-blocking layer, an active layer on the first conductive type second semiconductor layer; a second conductive type semiconductor layer on the active layer; and an electron spreading layer disposed between the etching-blocking layer and the active layer, wherein the electron spreading layer includes a first conductive type or an undoped AlGaN-based or a GaN-based semiconductor layer, an undoped AlN, and a first conductive type AlGaN-based second semiconductor layer.

14 Claims, 8 Drawing Sheets

(56) References Cited

U.S. PATENT DOCUMENTS

| | | | |
|---|---|---|---|
| 8,653,552 B2 | 2/2014 | Kazama | |
| 9,680,056 B1* | 6/2017 | Zhang | H01L 33/0025 |
| 2011/0104836 A1 | 5/2011 | Rode et al. | |
| 2011/0193057 A1* | 8/2011 | Sabathil | H01L 33/04 |
| | | | 257/13 |
| 2012/0086043 A1 | 4/2012 | Cho | |
| 2012/0119254 A1* | 5/2012 | Moon | H01L 33/025 |
| | | | 257/101 |
| 2012/0322186 A1 | 12/2012 | Rode et al. | |
| 2013/0285095 A1* | 10/2013 | Moon | H01L 33/22 |
| | | | 257/98 |
| 2017/0025566 A1 | 1/2017 | Song et al. | |

FOREIGN PATENT DOCUMENTS

| | | |
|---|---|---|
| JP | 2000-058916 | 2/2000 |
| JP | 2006-108518 | 4/2006 |
| JP | 2006-324669 | 11/2006 |
| JP | 2007-066940 | 3/2007 |
| JP | 2011-009521 | 1/2011 |
| JP | 2011-525708 | 9/2011 |
| JP | 2013-069900 | 4/2013 |
| JP | 2013-201411 | 10/2013 |
| JP | 2013-229598 | 11/2013 |
| KR | 10-0728132 | 6/2007 |
| KR | 10-2013-0120615 | 11/2013 |
| KR | 10-2014-0092958 | 7/2014 |
| KR | 10-2014-0102422 | 8/2014 |
| KR | 10-2015-0116251 | 10/2015 |
| WO | WO 2015/156588 | 10/2015 |

OTHER PUBLICATIONS

European Search Report dated Apr. 8, 2019 issued in Application No. 16864548.9.
Chinese Office Action dated Apr. 7, 2020 issued in Application No. 201680065564.0.

* cited by examiner

ULTRAVIOLET LIGHT-EMITTING ELEMENT AND LIGHT-EMITTING ELEMENT PACKAGE

CROSS-REFERENCE TO RELATED PATENT APPLICATIONS

This application is a U.S. National Stage Application under 35 U.S.C. § 371 of PCT Application No. PCT/KR2016/012852, filed Nov. 9, 2016, which claims priority to Korean Patent Application No. 10-2015-0156638, filed Nov. 9, 2015, whose entire disclosures are hereby incorporated by reference.

TECHNICAL FIELD

An embodiment relates to an ultraviolet light-emitting device, a method for manufacturing the ultraviolet light-emitting device, a light-emitting device package, and a lighting device.

BACKGROUND ART

A light emitting device (LED) is a p-n junction diode having a characteristic in which electric energy is converted into light energy, and may be formed by compounding Group III-V elements or Group II-VI elements on the periodic table, and may represent various colors by adjusting a composition ratio of a compound semiconductor.

A nitride semiconductor has received a great interest in a development field of an optical device and a high-output electronic device due to high thermal stability and wide band gap energy thereof. In particular, an ultraviolet (UV) LED, a blue LED, a green LED, a red LED, and the like using the nitride semiconductor are commercialized and used widely.

The UV LED is a light-emitting device that emits light in a wavelength range of 200 to 400 nm. The UV LED is composed of a short wavelength and a long wavelength depending on an application. The short wavelength is used for sterilization or purification, and the long wavelength may be used in an exposure apparatus or a curing apparatus, etc.

Meanwhile, an UV LED forms a light extraction pattern on an n-type semiconductor layer by a method such as photo electro chemical (PEC) or the like in order to improve light extraction efficiency.

However, over-etching of the light extraction pattern may occur in an n-type semiconductor layer, and the over-etching causes a short circuit. That is, the light extraction pattern by PEC of a general n-type semiconductor layer has had a problem of reduction in yield due to short circuit or the like.

Meanwhile, a general UV LED has had a problem that a current is concentrated in a region adjacent to electrodes.

DISCLOSURE

Technical Problem

An embodiment may provide an ultraviolet light-emitting device which is capable of improving electron spreading, a method for manufacturing the ultraviolet light-emitting device, a light-emitting device package, and a lighting device.

In addition, an embodiment may provide an ultraviolet light-emitting device which is capable of improving defects, a method for manufacturing the ultraviolet light-emitting device, a light-emitting device package, and a lighting device.

Technical Solution

An ultraviolet light-emitting device according to an embodiment includes: a first conductive type first semiconductor layer having a light extraction structure; an etching-blocking layer on the first conductive type first semiconductor layer; a first conductive type second semiconductor layer on the etching-blocking layer, an active layer on the first conductive type second semiconductor layer; a second conductive type semiconductor layer on the active layer; and an electron spreading layer disposed between the etching-blocking layer and the active layer, wherein the electron spreading layer includes a first conductive type or an undoped AlGaN-based or a GaN-based semiconductor layer, an undoped AlN, and a first conductive type AlGaN-based second semiconductor layer, so that it is possible to improve electron spreading by generating an internal field by piezoelectric due to a difference in lattice constant between the first conductive type or the undoped AlGaN-based or the GaN-based semiconductor layer and the undoped AlN, and inducing electron spreading at an interface between the first conductive type or the undoped AlGaN-based or the GaN-based semiconductor layer and the undoped AlN.

A light-emitting device package according to an embodiment may include the ultraviolet light-emitting device.

Advantageous Effects

In an ultraviolet light-emitting device of an embodiment, a depth of a light extraction pattern is restricted so that a reduction in yield due to a short circuit can be improved.

In addition, an ultraviolet light-emitting device of an embodiment can improve crystallinity.

In addition, an ultraviolet light-emitting device of an embodiment can improve electron spreading.

MODES OF THE INVENTION

In the description of embodiments, it will be understood that when a layer (or film), region, pattern or structure is referred to as being "on/over" or "under" another layer (or film), region, pattern or structure, the terminologies of "on/over" and "under" include both the meanings of "directly" and "by interposing another layer (indirectly)".

Further, the reference with respect to on/over" or "under" each layer will be made on the basis of drawings.

Figure 1:
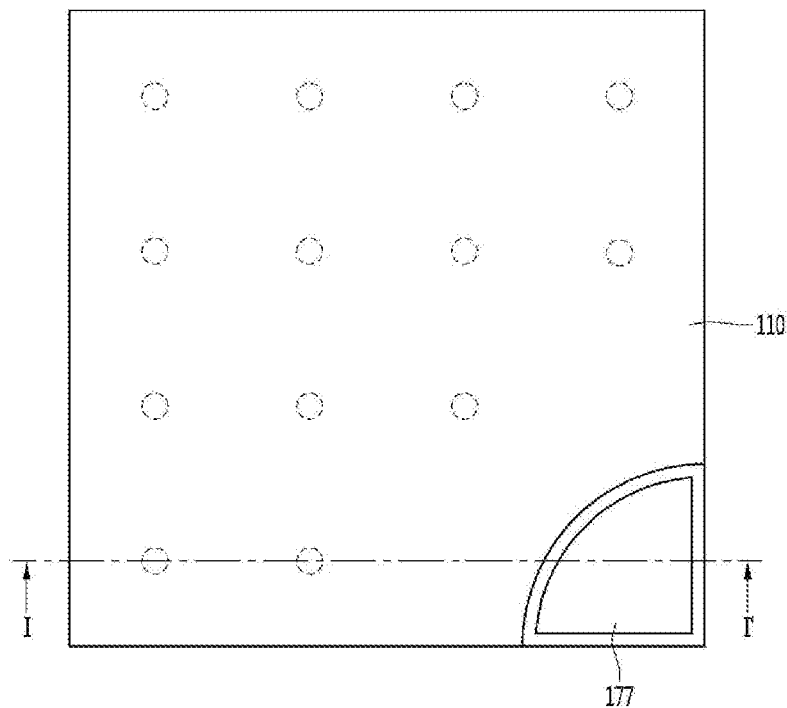
FIG. 1 is a plan view illustrating an ultraviolet light-emitting device according to an embodiment.
Figure 2:
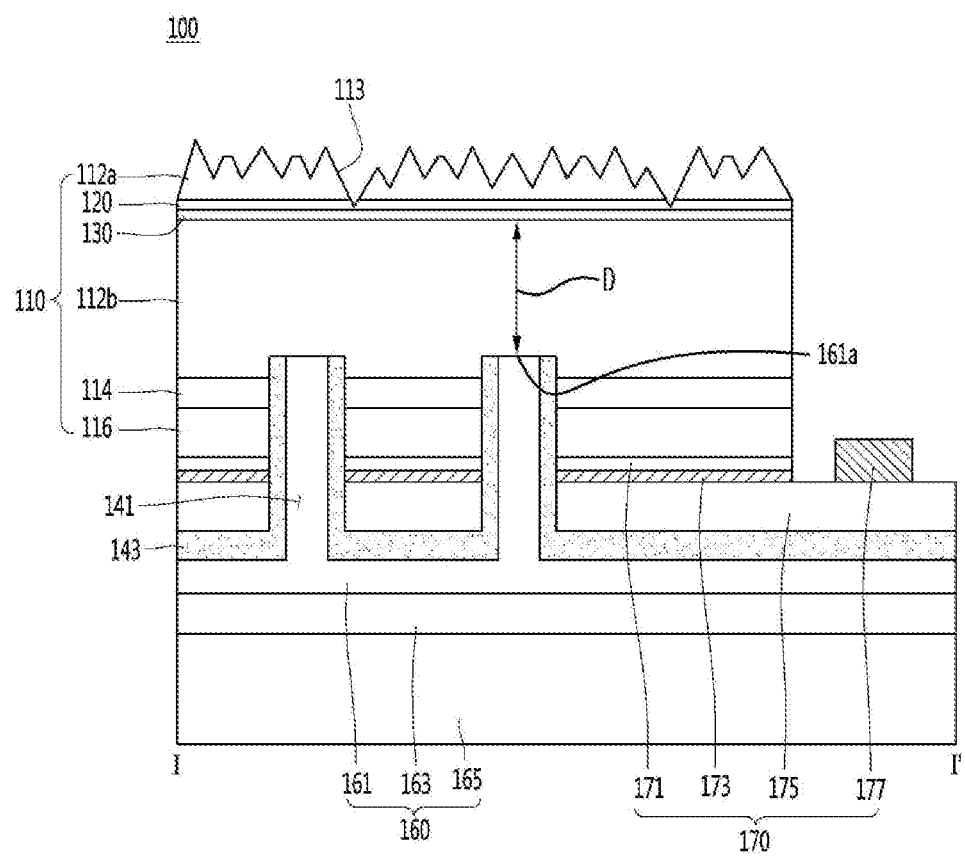
FIG. 2 is a cross-sectional view of the ultraviolet light-emitting device taken along a line I-I' of FIG. 1.
Figure 3:
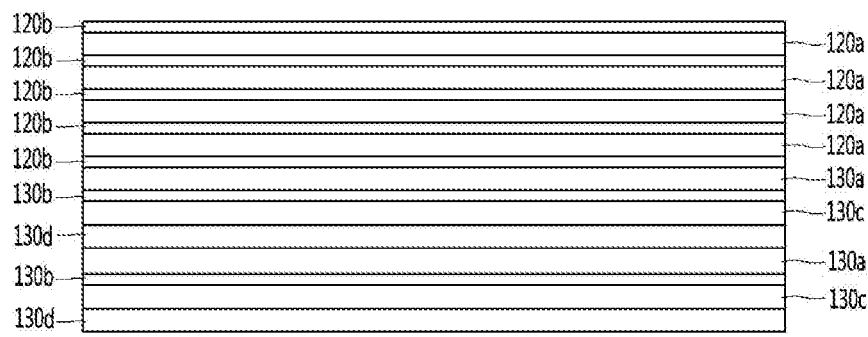
FIG. 3 is a cross-sectional view illustrating an etching-blocking layer and an electron spreading layer of the embodiment.
Figure 4:
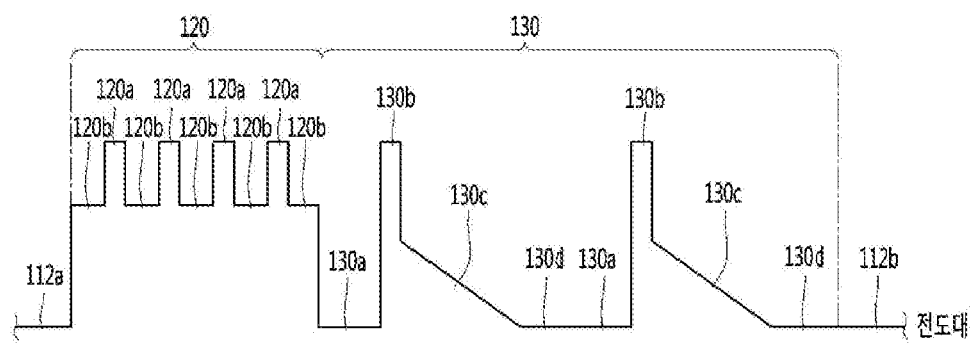
FIG. 4 is a view illustrating an energy band gap diagram of the etching-blocking layer and the electron spreading layer of the embodiment.
Figure 4:
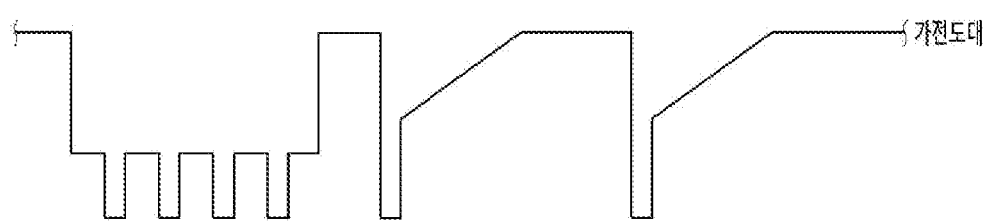

FIG. 1 is a plan view illustrating an ultraviolet light-emitting device according to an embodiment, FIG. 2 is a cross-sectional view of the ultraviolet light-emitting device taken along a line I-I' in FIG. 1, FIG. 3 is a cross-sectional view illustrating an etching-blocking layer and an electron spreading layer of the embodiment, and FIG. 4 is a diagram illustrating an energy band gap diagram of the etching-blocking layer and the electron spreading layer of the embodiment.

As shown in FIGS. 1 to 4, an ultraviolet light-emitting device 100 according to an embodiment may include a light-emitting structure 110.

The light-emitting structure 110 may include a first conductive type AlGaN-based first semiconductor layer 112a, an etching-blocking layer 120, an electron spreading layer 130, a first conductive type AlGaN-based second semiconductor layer 112b, an active layer 114 and a second conductive type AlGaN-based semiconductor layer 116.

The first conductive type AlGaN-based first semiconductor layer 112a and the first conductive type AlGaN-based second semiconductor layer 112b may be implemented as a semiconductor compound, for example, a semiconductor compound such as Group II-IV and Group III-V, and a first conductive type dopant may be doped. For example, the first conductive type AlGaN-based first semiconductor layer 112a and the first conductive type AlGaN-based second semiconductor layer 112b may include a semiconductor material having a empirical formula of $Al_nGa_{1-n}N$ ($0 \le n \le 1$). When the first conductive type AlGaN-based first semiconductor layer 112a and the first conductive type AlGaN-based second semiconductor layer 112b are an n-type semiconductor layer, it is possible to include Si, Ge, Sn, Se, and Te as an n-type dopant, but the present invention is not limited thereto.

The first conductive type AlGaN-based first semiconductor layer 112a may include a light extraction pattern 113 for improving light extraction efficiency. The light extraction pattern 113 may be formed by a method such as PEC, but is not limited thereto. The light extraction pattern 113 may be formed to have a regular shape and arrangement, and may be formed to have an irregular shape and arrangement. The light extraction pattern 113 may refract to an outside light generated from the active layer 114 and totally reflected from an upper surface of the first conductive type AlGaN-based first semiconductor layer 112a to be reabsorbed, thereby improving the light extraction efficiency.

A thickness of the first conductive type AlGaN-based second semiconductor layer 112b may be 1500 nm or more. For example, the thickness of the first conductive type AlGaN-based second semiconductor layer 112b may be 1500 to 2500 nm, but is not limited thereto.

The etching-blocking layer 120 may limit a formative depth of the light extraction pattern 113. For example, the etching-blocking layer 120 may include an AlN 120a and a first conductive type AlGaN-based third semiconductor layer 120b. Here, the AlN 120a may include a first conductive type dopant, but is not limited thereto. Al of the AlN 120a has larger bonding energy than Ga of the first conductive type AlGaN-based first semiconductor layer 112a. As a result, an etching rate of the etching-blocking layer 120 may be slower than that of the first conductive type AlGaN-based first semiconductor layer 112a. Accordingly, it is difficult for the light extraction pattern 113 to have a depth penetrating through the etching-blocking layer 120 by the slow etching rate of the etching-blocking layer 120 while the light extraction pattern 113 is formed by etching the first conductive type AlGaN-based first semiconductor layer 112a. The etching-blocking layer 120 may be formed such that the AlN 120a and the first conductive type AlGaN-based third semiconductor layer 120b are alternated in five or more pairs. For example, the etching-blocking layer 120 may be formed such that the AlN 120a and the first conductive type AlGaN-based third semiconductor layer 120b are alternated in 5 to 15 pairs. When the AlN 120a and the first conductive type AlGaN-based third semiconductor layer 120b are alternated in less than five pairs, an etching-blocking effect of the etching-blocking layer 120 may be deteriorated. When the AlN 120a and the first conductive type AlGaN-based third semiconductor layer 120b are alternated in more than 15 pairs, crystallinity of the etching-blocking layer 120 may be deteriorated due to a difference in lattice constant.

A thickness of the AlN 120a may be 0.5 nm or more. For example, the thickness of the AlN 120a may be 0.5 to 3 nm. When the thickness of the AlN 120a is less than 0.5 nm, the etching-blocking effect may be deteriorated. When the thickness of the AlN 120a exceeds 3 nm, the crystallinity may be deteriorated by the AlN 120a in which lattice is small, and carrier injection efficiency may be deteriorated.

A thickness of the first conductive type AlGaN-based third semiconductor layer 120b may be 1 nm or more. For example, the thickness of the first conductive type AlGaN-based third semiconductor layer 120b may be 1 to 5 nm. When the thickness of the first conductive type AlGaN-based third semiconductor layer 120b is less than 1 nm, an electron spreading effect may be deteriorated, and when the thickness of the first conductive type AlGaN-based third semiconductor layer 120b exceeds 5 nm, the crystallinity may be deteriorated. The first conductive type AlGaN-based third semiconductor layer 120b may be $Al_aGa_{1-a}N$ ($0.4 \le a \le 0.8$). When an aluminum (Al) composition (a) is less than 0.4, the etching-blocking effect may be deteriorated, and when the aluminum (Al) composition (a) exceeds 0.8, the crystallinity may be deteriorated.

A total thickness of the etching-blocking layer 120 may be 15 to 25 nm. When the thickness of the etching-blocking layer 120 is less than 15 nm, the electron spreading effect may be deteriorated, and when the thickness of the etching-blocking layer 120 exceeds 25 nm, the crystallinity may be deteriorated.

In the ultraviolet light-emitting device 100 of the embodiment, since the etching-blocking layer 120 is formed between the first conductive type AlGaN-based first semiconductor layer 112a and the first conductive type AlGaN-based second semiconductor layer 112b to limit a depth of the light extraction pattern 113, over-etching may be improved. Accordingly, the ultraviolet light-emitting device of the embodiment may improve a reduction in yield due to a short circuit.

In addition, the ultraviolet light-emitting device 100 of the embodiment may include a dislocation blocking effect by the AlN 120a and the first conductive type AlGaN-based third semiconductor layer 120b which are alternately formed in five or more pairs.

The ultraviolet light-emitting device 100 of the embodiment may include an electron spreading layer 130 under the etching-blocking layer 120. The electron spreading layer 130 may be formed at a higher temperature than that of the etching-blocking layer 120. The electron spreading layer 130 may be grown at a higher temperature than that of the etching-blocking layer 120 to improve defects of the etching-blocking layer 120.

The electron spreading layer 130 may be disposed between the etching-blocking layer 120 and the first conductive type AlGaN-based second semiconductor layer 112b. The electron spreading layer 130 may improve crystal defects and improve electron spreading simultaneously. For example, the electron spreading layer 130 may include a first conductive type AlGaN-based fourth semiconductor layer 130a, an undoped AlN 130b, a first conductive type AlGaN-based fifth semiconductor layer 130c, and an undoped AlGaN-based semiconductor layer 130d. The electron spreading layer 130 may generate an internal field by piezo-electric due to a difference in lattice constant between the first conductive type AlGaN-based fourth semiconductor layer 130a and the undoped AlN 130b, so that electron spreading may be induced at an interface between the first conductive type AlGaN-based fourth semiconductor layer 130a and the undoped AlN 130b. The electron spreading layer 130 may be formed such that the first conductive type AlGaN-based fourth semiconductor layer 130a, the undoped AlN 130b, the first conductive type AlGaN-based fifth semiconductor layer 130c, and the undoped AlGaN-based semiconductor layer 130d are alternated in two pairs or more. For example, the electron spreading layer 130 may be formed such that the first conductive type AlGaN-based fourth semiconductor layer 130a, the undoped AlN 130b, the first conductive type AlGaN-based fifth semiconductor layer 130c, and the undoped AlGaN-based semiconductor layer 130d are alternated in two to four pairs. When the electron spreading layer 130 is formed such that the first conductive type AlGaN-based fourth semiconductor layer 130a, the undoped AlN 130b, the first conductive type AlGaN-based fifth semiconductor layer 130c, and the undoped AlGaN-based semiconductor layer 130d are alternated in less than two pairs, the electron spreading effect may be deteriorated. When the electron spreading layer 130 is formed such that the first conductive type AlGaN-based fourth semiconductor layer 130a, the undoped AlN 130b, the first conductive type AlGaN-based fifth semiconductor layer 130c, and the undoped AlGaN-based semiconductor layer 130d are alternated in more than four pairs, the crystallinity may be deteriorated.

The first conductive type AlGaN-based fourth semiconductor layer 130a may be disposed between the etching-blocking layer 120 and the undoped AlN 130b. The first conductive type AlGaN-based fourth semiconductor layer 130a may be disposed between the undoped AlGaN-based semiconductor layer 130d and the undoped AlN 130b. A thickness of the first conductive type AlGaN-based fourth semiconductor layer 130a may be 5 nm or more. For example, the thickness of the first conductive type AlGaN-based fourth semiconductor layer 130a may be 5 to 20 nm. When the thickness of the first conductive type AlGaN-based fourth semiconductor layer 130a is less than 5 nm, the electron spreading effect may be deteriorated. When the thickness of the first conductive type AlGaN-based fourth semiconductor layer 130a exceeds 20 nm, a total thickness of the electron spreading layer 130 may become thick. Here, the first conductive type AlGaN-based fourth semiconductor layer 130a may include a first conductive type dopant in the embodiment, but is not limited thereto, and the first conductive type AlGaN-based fourth semiconductor layer 130a may be an undoped AlGaN-based semiconductor layer.

The undoped AlN 130b may be disposed between the first conductive type AlGaN-based fourth semiconductor layer 130a and the first conductive type AlGaN-based fifth semiconductor layer 130c. The undoped AlN 130b may have larger band gap energy than that of the first conductive type AlGaN-based fourth semiconductor layer 130a. A thickness of the undoped AlN 130b may be 0.5 nm or more. For example, the thickness of the undoped AlN 130b may be 0.5 to 1.5 nm. When the thickness of the undoped AlN 130b is less than 0.5 nm, the electron spreading effect may be deteriorated. When the thickness of the undoped AlN 130b exceeds 1.5 nm, the crystallinity may be deteriorated.

The first conductive type AlGaN-based fifth semiconductor layer 130c may be disposed between the undoped AlN 130b and the undoped AlGaN-based semiconductor layer 130d, and an Al composition may be gradually lowered as toward the undoped AlGaN-based semiconductor layer 130d. The Al composition of the first conductive type AlGaN-based fifth semiconductor layer 130c gradually decreases as toward the undoped AlGaN-based semiconductor layer 130d from the undoped AlN 130b, and thus the crystallinity may be improved. The first conductive type AlGaN-based fifth semiconductor layer 130c may be $Al_bGa_{1-b}N$ (0.25≤b≤0.35). When an aluminum (Al) composition (b) is less than 0.25, the electron spreading effect may be deteriorated. When the aluminum (Al) composition (b) exceeds 0.35, the crystallinity may be deteriorated. A thickness of the first conductive type AlGaN-based fifth semiconductor layer 130c may be 15 nm or more. For example, the thickness of the first conductive type AlGaN-based fifth semiconductor layer 130c may be 15 to 25 nm. When the thickness of the first conductive type AlGaN-based fifth semiconductor layer 130c is less than 15 nm, the electron spreading effect may be deteriorated. When the thickness of the first conductive type AlGaN-based fifth semiconductor layer 130c exceeds 25 nm, the crystallinity may be deteriorated.

The undoped AlGaN-based semiconductor layer 130d may be disposed between the first conductive type AlGaN-based fifth semiconductor layer 130c and the first conductive type AlGaN-based fourth semiconductor layer 130a. The undoped AlGaN-based semiconductor layer 130d may be disposed between the first conductive type AlGaN-based fifth semiconductor layer 130c and the first conductive type AlGaN-based second semiconductor layer 112b. A thickness of the undoped AlGaN-based semiconductor layer 130d may be 3 nm or more. For example, the thickness of the undoped AlGaN-based semiconductor layer 130d may be 3 to 10 nm. When the thickness of the undoped AlGaN-based semiconductor layer 130d is less than 3 nm, the electron spreading effect may be deteriorated. When the thickness of the undoped AlGaN-based semiconductor layer 130d exceeds 10 nm, an operating voltage Vf may increase.

In the ultraviolet light-emitting device 100 of an embodiment, the electron spreading layer 130 may be disposed between the etching-blocking layer 120 and the first conductive type AlGaN-based second semiconductor layer 112b, and thus the electron spreading effect may be improved.

In addition, in the ultraviolet light-emitting device 100 of an embodiment, since the electron spreading layer 130 formed at a higher temperature than that of the etching-blocking layer 120 is formed after the etching-blocking layer 120 is formed, the defects caused by the etching-blocking layer 120 may be blocked from proceeding to the first conductive type AlGaN-based second semiconductor layer 112b, and thus the crystallinity of the light-emitting device may be improved.

The active layer 114 may be formed as at least one of a single quantum well structure, a multi-quantum well (MQW) structure, a quantum-wire structure, and a quantum dot structure.

The active layer 114 is a layer at which electrons (or holes) injected through the first conductive type AlGaN-based second semiconductor layer 112b encounters holes (or electrons) injected through the second conductive type AlGaN-based semiconductor layer 116, and light is emitted by a band gap difference of an energy band according to a formative material of the active layer 114.

The active layer 114 may be composed of a compound semiconductor. The active layer 114, for example, may be implemented as at least one of Group II-IV and Group III-V compound semiconductors.

The active layer 114 may include a quantum well and a quantum wall. When the active layer 114 is implemented as an MQW structure, the quantum well and the quantum wall may be alternately disposed. The quantum well and the quantum wall may be disposed with a semiconductor material having an empirical formula of $In_xAl_yGa_{1-x-y}N$ ($0 \leq x \leq 1$, $0 \leq y \leq 1$, $0 \leq x+y \leq 1$) respectively or may be formed as any one or more pairs of structures of AlGaN/GaN, AlGaN/AlGaN, InGaN/GaN, InGaN/InGaN, InAlGaN/GaN, GaAs/AlGaAs, InGaAs/Al GaAs, GaP/AlGaP, and InGaP/AlGaP, but are not limited thereto.

The second conductive type AlGaN-based semiconductor layer 116 may be implemented as a semiconductor compound, for example, a compound semiconductor such as Group II-IV and Group III-V, and may be doped with a second conductive type dopant. For example, the second conductive type AlGaN-based semiconductor layer 116 may include a semiconductor material having an empirical formula of $Al_pGa_{1-p}N$ ($0 \leq p \leq 1$). When the second conductive type AlGaN-based semiconductor layer 116 is a p-type semiconductor layer, the second conductive type dopant may include Mg, Zn, Ca, Sr, Ba, etc. as a p-type dopant.

Although the first conductive type AlGaN-based first semiconductor layer 112a and the first conductive type AlGaN-based second semiconductor layer 112b are referred to as the n-type semiconductor layer and the second conductive type AlGaN-based semiconductor layer 116 is referred to as the p-type semiconductor layer, the first conductive type AlGaN-based first semiconductor layer 112a and the first conductive type AlGaN-based second semiconductor layer 112b may be formed as the p-type semiconductor layer, the second conductive type AlGaN-based semiconductor layer 116 may be formed as the n-type semiconductor layer, and are not limited thereto. A semiconductor having a polarity opposite to that of the second conductive type, for example, an n-type semiconductor layer (not shown) may be formed on the second conductive type AlGaN-based semiconductor layer 116. Accordingly, the light-emitting structure 110 may be implemented as any one structure of an n-p junction structure, a p-n junction structure, an n-p-n junction structure, and a p-n-p junction structure.

The first electrode 170 may be disposed under the light-emitting structure 110. The first electrode 170 may be disposed between the light-emitting structure 110 and a second electrode 160. The first electrode 170 may be electrically connected to the second conductive type AlGaN-based semiconductor layer 116. The first electrode 170 may be electrically insulated from the second electrode 160. The first electrode 170 may include a contact layer 171, a reflective layer 173, a capping layer 175, and a pad 177.

The contact layer 171 may be disposed under the second conductive type AlGaN-based semiconductor layer 116. The contact layer 171 may be in direct contact with the second conductive type AlGaN-based semiconductor layer 116. The contact layer 171 may be disposed between the second conductive type AlGaN-based semiconductor layer 116 and the reflective layer 173. The contact layer 171 may be electrically connected to the second conductive type AlGaN-based semiconductor layer 116. The contact layer 171 may be a conductive oxide, a conductive nitride, or a metal. For example, the contact layer 171 may include at least one of indium tin oxide (ITO), ITO nitride (ITON), indium zinc oxide (IZO), IZO nitride (IZON), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, In, Au, W, Al, Pt, Ag and Ti.

The reflective layer 173 may be disposed between the contact layer 171 and the capping layer 175. The reflective layer 173 may be electrically connected to the contact layer 171 and the capping layer 175. The reflective layer 173 may include a function of reflecting light incident from the light-emitting structure 110. The reflective layer 173 may improve the light extraction efficiency by reflecting light from the light-emitting structure 110 to the outside. The reflective layer 173 may be a metal. For example, the reflective layer 173 may be a metal or an alloy including at least one of Ag, Ni, Al, Rh, Pd, Ir, Ru, Mg, Zn, Pt, Cu, Au and Hf. The reflective layer 173 may be formed in a single layer or multiple layers including the metal or the alloy and a transparent conductive material, such as ITO, IZO, IZTO, IAZO, IGZO, IGTO, AZO, or ATO.

The capping layer 175 may be disposed under the reflective layer 173. The capping layer 175 may be in direct contact with a lower surface of the reflective layer 173. The capping layer 175 may be disposed under the pad 177. The capping layer 175 may be electrically connected to the pad 177. The capping layer 175 may be in direct contact with a lower surface of the pad 177. The capping layer 175 may provide a driving power supplied from the pad 177 to the light-emitting structure 110. The capping layer 175 may be a conductive material. For example, the capping layer 175 may include at least one of Au, Cu, Ni, Ti, Ti—W, Cr, W, Pt, V, Fe, and Mo, and may be formed in a single layer or multiple layers. An edge of the capping layer 175 may be disposed further outward than that of the light-emitting structure 110.

The pad 177 may be spaced apart from the light-emitting structure 110. The pad 177 may be disposed further outward than the light-emitting structure 110. The pad 177 may be disposed on the capping layer 175, which is located further outward than the light-emitting structure 110. The pad 177 may include at least one of Cu, Ni, Ti, Ti—W, Cr, W, Pt, V, Fe and Mo and may be formed in a single layer or multiple layers.

The second electrode 160 may be disposed under the first electrode 170. The second electrode 160 may be electrically connected to the first conductive type AlGaN-based second semiconductor layer 112b. The second electrode 160 may include a diffusion-barrier layer 161, a bonding layer 163, and a support member 165. The second electrode 160 may selectively include one or two of the diffusion-barrier layer 161, the bonding layer 163, and the support member 165. For example, the second electrode 160 may remove at least one of the diffusion-barrier layer 161 and the bonding layer 163.

In the ultraviolet light-emitting device 100 of an embodiment, a distance D between a contact portion 161a of the diffusion-barrier layer 161, which is contact with the first conductive type AlGaN-based second semiconductor layer 112*b*, and the electron spreading layer 130 may be 800 nm or more. For example, the distance D between the contact portion 161*a* and the electron spreading layer 130 may be 800 to 1200 nm, but is not limited thereto.

The diffusion-barrier layer 161 may include a function of preventing diffusion of a material included in the bonding layer 163 into the first electrode 170. The diffusion-barrier layer 161 may be electrically connected to the bonding layer 163 and the support member 165. The diffusion-barrier layer 161 may include at least one of Cu, Ni, Ti, Ti—W, Cr, W, Pt, V, Fe, and Mo, and may be formed in a single layer or multiple layers.

The bonding layer 163 may be disposed under the diffusion-barrier layer 161. The bonding layer 163 may be disposed between the diffusion-barrier layer 161 and the support member 165. The bonding layer 163 may include a barrier metal or a bonding metal, etc. For example, the bonding layer 163 may include at least one of Ti, Au, Sn, Ni, Cr, Ga, In, Bi, Cu, Ag, Nb, Pd, and Ta, and may be formed in a single layer or multiple layers.

The support member 165 may be a metal or a carrier substrate. For example, the support member 165 may be formed as at least any one of semiconductor substrates (e.g., Si, Ge, GaN, GaAs, ZnO, SiC, SiGe, etc.) into which Ti, Cr, Ni, Al, Pt, Au, W, Cu, Mo, Cu—W, or impurities are injected, and may be formed in a single layer or multiple layers.

In the ultraviolet light-emitting device 100 of an embodiment, the etching-blocking layer 120 may be formed between the first conductive type AlGaN-based first semiconductor layer 112*a* and the first conductive type AlGaN-based second semiconductor layer 112*b* to limit the depth of the light extraction pattern 113 to the etching-blocking layer 120, and thus the reduction in yield due to a short circuit in the first conductive type AlGaN-based second semiconductor layer 112*b* may be improved.

In addition, in the ultraviolet light-emitting device of an embodiment, the crystallinity of the light-emitting structure 110 may be improved by the dislocation blocking effect due to the etching-blocking layer 120 including the AlN 120*a* and the first conductive type AlGaN-based third semiconductor layer 120*b* which are alternately formed in five or more pairs.

In the ultraviolet light-emitting device 100 of an embodiment, the electron spreading layer 130 may be disposed between the etching-blocking layer 120 and the first conductive type AlGaN-based second semiconductor layer 112*b*, and thus the electron spreading effect may be improved.

In addition, in the ultraviolet light-emitting device 100 of an embodiment, since the electron spreading layer 130 formed at a higher temperature than that of the etching-blocking layer 120 is formed after the etching-blocking layer 120 is formed, the defects caused by the etching-blocking layer 120 may be blocked from proceeding to the first conductive type AlGaN-based second semiconductor layer 112*b*, and thus the crystallinity of the light-emitting device may be improved.

FIGS. 5 to 9 are cross-sectional views illustrating a method for manufacturing an ultraviolet light-emitting device according to an embodiment.

Figure 5:
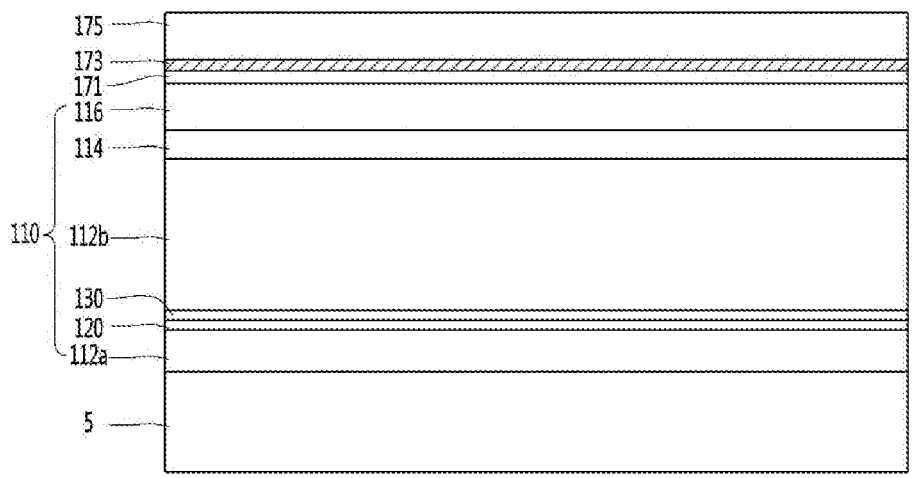
FIGS. 5 to 9 are cross-sectional views illustrating a method for manufacturing an ultraviolet light-emitting device according to an embodiment.

Referring to FIGS. 3 and 5, a light-emitting structure 110, a contact layer 171, a reflective layer 173, and a capping layer 175 may be formed on a substrate 5.

The substrate 5 may be formed of a material having superior thermal conductivity, and may be a conductive substrate or an insulating substrate. For example, the substrate 5 may use at least one of sapphire ($Al_2O_3$), SiC, Si, GaAs, GaN, ZnO, GaP, InP, Ge, and $Ga_2O_3$. A concave-convex structure may be formed on the substrate 5, but the substrate 5 is not limited thereto.

The light-emitting structure 110 may be formed by a metal organic chemical vapor deposition (MOCVD) method, a chemical vapor deposition (CVD) method, a plasma enhanced chemical vapor deposition (PECVD) method, a molecular beam epitaxy (MBE), and hydride vapor phase epitaxy (HVPE), or the like, but is not limited thereto.

The light-emitting structure 110 may include a first conductive type AlGaN-based first semiconductor layer 112*a*, an etching-blocking layer 120, an electron spreading layer 130, a first conductive type AlGaN-based second semiconductor layer 112*b*, an active layer 114 and a second conductive type AlGaN-based semiconductor layer 116.

The first conductive type AlGaN-based first semiconductor layer 112*a* and the first conductive type AlGaN-based second semiconductor layer 112*b* may be implemented as a semiconductor compound, for example, a semiconductor compound such as Group II-IV and Group III-V, and a first conductive type dopant may be doped. For example, the first conductive type AlGaN-based first semiconductor layer 112*a* and the first conductive type AlGaN-based second semiconductor layer 112*b* may include a semiconductor material having an empirical formula of $Al_nGa_{1-n}N$ ($0 \leq n \leq 1$). When the first conductive type AlGaN-based first semiconductor layer 112*a* and the first conductive type AlGaN-based second semiconductor layer 112*b* are an n-type semiconductor layer, it is possible to include Si, Ge, Sn, Se, and Te as an n-type dopant, but the present invention is not limited thereto.

A thickness of the first conductive type AlGaN-based second semiconductor layer 112*b* may be 1500 nm or more. For example, the thickness of the first conductive type AlGaN-based second semiconductor layer 112*b* may be 1500 to 2500 nm, but is not limited thereto.

The etching-blocking layer 120 may be formed between the first conductive type AlGaN-based first semiconductor layer 112*a* and the first conductive type AlGaN-based second semiconductor layer 112*b*. The etching-blocking layer 120 may limit a formative depth of the light extraction pattern 113 of the first conductive type AlGaN-based first semiconductor layer 112*a* formed in a post-process of the light-emitting device manufacturing process. For example, the etching-blocking layer 120 may include an AlN 120*a* and a first conductive type AlGaN-based third semiconductor layer 120*b*. Here, the AlN 120*a* may include a first conductive type dopant, but is not limited thereto. The Al of the AlN 120*a* has larger bonding energy than the Ga of the first conductive type AlGaN-based first semiconductor layer 112*a*. As a result, the etching rate of the etching-blocking layer 120 may be slower than that of the first conductive type AlGaN-based first semiconductor layer 112*a*. Accordingly, it is difficult for the light extraction pattern 113 to have a depth penetrating through the etching-blocking layer 120 by the slow etching rate of the etching-blocking layer 120 while the light extraction pattern 113 is formed by etching the first conductive type AlGaN-based first semiconductor layer 112*a*. The etching-blocking layer 120 may be formed such that the AlN 120*a* and the first conductive type AlGaN-based third semiconductor layer 120*b* are alternated in five or more pairs. For example, the etching-blocking layer 120 may be formed such that the AlN 120*a* and the first conductive type AlGaN-based third semiconductor layer 120*b* are alternated in 5 to 15 pairs. When the etching-blocking layer 120 is formed such that the AlN 120*a* and the first conductive type AlGaN-based third semiconductor layer 120*b* are alternated in less than five pairs, an etching-blocking effect may be deteriorated. When the etching-blocking layer 120 is formed such that the AlN 120*a* and the first conductive type AlGaN-based third semiconductor layer 120*b* are alternated in more than 15 pairs, crystallinity may be deteriorated due to a difference in lattice constant.

A thickness of the AlN 120*a* may be 0.5 nm or more. For example, the thickness of the AlN 120*a* may be 0.5 to 3 nm. When the thickness of the AlN 120*a* is less than 0.5 nm, the etching-blocking effect may be deteriorated. When the thickness of the AlN 120*a* exceeds 3 nm, the crystallinity may be deteriorated by the AlN 120*a* in which a lattice is small, and carrier injection efficiency may be deteriorated.

A thickness of the first conductive type AlGaN-based third semiconductor layer 120*b* may be 1 nm or more. For example, the thickness of the first conductive type AlGaN-based third semiconductor layer 120*b* may be 1 to 5 nm. When the thickness of the first conductive type AlGaN-based third semiconductor layer 120*b* is less than 1 nm, an electron spreading effect may be deteriorated, and when the thickness of the first conductive type AlGaN-based third semiconductor layer 120*b* exceeds 5 nm, the crystallinity may be deteriorated. The first conductive type AlGaN-based third semiconductor layer 120*b* may be $Al_aGa_{1-a}N$ ($0.4 \leq a \leq 0.8$). When an aluminum (Al) composition (a) is less than 0.4, the etching-blocking effect may be deteriorated, and when the aluminum (Al) composition (a) exceeds 0.8, the crystallinity may be deteriorated.

A total thickness of the etching-blocking layer 120 may be 15 to 25 nm. When the thickness of the etching-blocking layer 120 is less than 15 nm, the electron spreading effect may be deteriorated, and when the thickness of the etching-blocking layer 120 exceeds 25 nm, the crystallinity may be deteriorated.

In the ultraviolet light-emitting device of an embodiment, since the etching-blocking layer 120 is formed between the first conductive type AlGaN-based first semiconductor layer 112*a* and the first conductive type AlGaN-based second semiconductor layer 112*b* so that a depth of the light extraction pattern is limited, over-etching may be improved. Therefore, the ultraviolet light-emitting device of an embodiment may improve a reduction in yield due to a short circuit.

In addition, the ultraviolet light-emitting device of an embodiment may include a dislocation blocking effect by the AlN 120*a* and the first conductive type AlGaN-based third semiconductor layer 120*b*, which are alternately formed in five or more pairs.

In the ultraviolet light-emitting device of an embodiment, the electron spreading layer 130 may be formed on the etching-blocking layer 120. The electron spreading layer 130 may be in direct contact with the etching-blocking layer 120. The electron spreading layer 130 may be formed at a higher temperature than that of the etching-blocking layer 120. The electron spreading layer 130 may be grown at a higher temperature than that of that of the etching-blocking layer 120 to improve a defect of the etching-blocking layer 120.

The electron spreading layer 130 may be formed between the etching-blocking layer 120 and the first conductive type AlGaN-based second semiconductor layer 112*b*. The electron spreading layer 130 may improve a crystal defect and improve electron spreading simultaneously. For example, the electron spreading layer 130 may include a first conductive type AlGaN-based fourth semiconductor layer 130*a*, an undoped AlN 130*b*, a first conductive type AlGaN-based fifth semiconductor layer 130*c*, and an undoped AlGaN-based semiconductor layer 130*d*. The electron spreading layer 130 may generate an internal field due to piezo-electric due to a difference in lattice constant between the first conductive type AlGaN-based fourth semiconductor layer 130*a* and the undoped AlN 130*b* and may induce electron spreading at an interface between the first conductive type AlGaN-based fourth semiconductor layer 130*a* and the undoped AlN 130*b*. The electron spreading layer 130 may be formed such that the first conductive type AlGaN-based fourth semiconductor layer 130*a*, the undoped AlN 130*b*, the first conductive type AlGaN-based fifth semiconductor layer 130*c*, and the undoped AlGaN-based semiconductor layer 130*d* are alternated in two pairs or more. For example, the electron spreading layer 130 may be formed such that the first conductive type AlGaN-based fourth semiconductor layer 130*a*, the undoped AlN 130*b*, the first conductive type AlGaN-based fifth semiconductor layer 130*c*, and the undoped AlGaN-based semiconductor layer 130*d* are alternated in two to four pairs. When the electron spreading layer 130 is formed such that the first conductive type AlGaN-based fourth semiconductor layer 130*a*, the undoped AlN 130*b*, the first conductive type AlGaN-based fifth semiconductor layer 130*c*, and the undoped AlGaN-based semiconductor layer 130*d* are alternated in less than two pairs, the electron spreading effect may be deteriorated. When the electron spreading layer 130 is formed such that the first conductive type AlGaN-based fourth semiconductor layer 130*a*, the undoped AlN 130*b*, the first conductive type AlGaN-based fifth semiconductor layer 130*c*, and the undoped AlGaN-based semiconductor layer 130*d* are alternated in more than four pairs, the crystallinity may be deteriorated.

The first conductive type AlGaN-based fourth semiconductor layer 130*a* may be formed between the etching-blocking layer 120 and the undoped AlN 130*b*. The first conductive type AlGaN-based fourth semiconductor layer 130*a* may be formed between the undoped AlGaN-based semiconductor layer 130*d* and the undoped AlN 130*b*. A thickness of the first conductive type AlGaN-based fourth semiconductor layer 130*a* may be 5 nm or more. For example, the thickness of the first conductive type AlGaN-based fourth semiconductor layer 130*a* may be 5 to 20 nm. When the thickness of the first conductive type AlGaN-based fourth semiconductor layer 130*a* is less than 5 nm, the electron spreading effect may be deteriorated. When the thickness of the first conductive type AlGaN-based fourth semiconductor layer 130*a* exceeds 20 nm, the total thickness of the etching-blocking layer 120 may become thick. Here, the first conductive type AlGaN-based fourth semiconductor layer 130*a* includes a first conductive type dopant in the embodiment, but is not limited thereto, and the first conductive type AlGaN-based fourth semiconductor layer 130*a* may be an undoped AlGaN-based semiconductor layer.

The undoped AlN 130*b* may be formed between the first conductive type AlGaN-based fourth semiconductor layer 130*a* and the first conductive type AlGaN-based fifth semiconductor layer 130*c*. The undoped AlN 130*b* may have larger band gap energy than that of the first conductive type AlGaN-based fourth semiconductor layer 130*a*. A thickness of the undoped AlN 130*b* may be 0.5 nm or more. For example, the thickness of the undoped AlN 130*b* may be 0.5 to 1.5 nm. When the thickness of the undoped AlN 130*b* is less than 0.5 nm, the electron spreading effect may be deteriorated. When the thickness of the undoped AlN 130*b* exceeds 1.5 nm, the crystallinity may be deteriorated.

The first conductive type AlGaN-based fifth semiconductor layer 130c may be formed between the undoped AlN 130b and the undoped AlGaN-based semiconductor layer 130d, and an Al composition may be gradually lowered as toward the undoped AlGaN-based semiconductor layer 130d. The Al composition of the first conductive type AlGaN-based fifth semiconductor layer 130c gradually decreases as toward the undoped AlGaN-based semiconductor layer 130d from the undoped AlN 130b, and thus the crystallinity may be improved. The first conductive type AlGaN-based fifth semiconductor layer 130c may be $Al_bGa_{1-b}N$ ($0.25 \leq b \leq 0.35$). When an aluminum (Al) composition (b) is less than 0.25, the electron spreading effect may be deteriorated. When the aluminum (Al) composition (b) exceeds 0.35, the crystallinity may be deteriorated. A thickness of the first conductive type AlGaN-based fifth semiconductor layer 130c may be 15 nm or more. For example, the thickness of the first conductive type AlGaN-based fifth semiconductor layer 130c may be 15 to 25 nm. When the thickness of the first conductive type AlGaN-based fifth semiconductor layer 130c is less than 15 nm, the electron spreading effect may be deteriorated. When the thickness of the first conductive type AlGaN-based fifth semiconductor layer 130c exceeds 25 nm, the crystallinity may be deteriorated.

The undoped AlGaN-based semiconductor layer 130d may be disposed between the first conductive type AlGaN-based fifth semiconductor layer 130c and the first conductive type AlGaN-based fourth semiconductor layer 130a. The undoped AlGaN-based semiconductor layer 130d may be disposed between the first conductive type AlGaN-based fifth semiconductor layer 130c and the first conductive type AlGaN-based second semiconductor layer 112b. A thickness of the undoped AlGaN-based semiconductor layer 130d may be 3 nm or more. For example, the thickness of the undoped AlGaN-based semiconductor layer 130d may be 3 to 10 nm. When the thickness of the undoped AlGaN-based semiconductor layer 130d is less than 3 nm, the electron spreading effect may be deteriorated. When the thickness of the undoped AlGaN-based semiconductor layer 130d exceeds 10 nm, an operating voltage Vf may increase.

In the ultraviolet light-emitting device of an embodiment, the electron spreading layer 130 may be disposed between the etching-blocking layer 120 and the first conductive type AlGaN-based second semiconductor layer 112b, and thus the electron spreading effect may be improved.

In addition, in the ultraviolet light-emitting device of an embodiment, since the electron spreading layer 130 formed at a higher temperature than that of the etching-blocking layer 120 is formed after the etching-blocking layer 120 is formed, a defect caused by the etching-blocking layer 120 may be blocked from proceeding to the first conductive type AlGaN-based second semiconductor layer 112b, and thus the crystallinity of the light-emitting device may be improved.

The active layer 114 may be formed as at least one of a single quantum well structure, a multi-quantum well (MQW) structure, a quantum-wire structure, and a quantum dot structure.

The active layer 114 is a layer at which electrons (or holes) injected through the first conductive type AlGaN-based second semiconductor layer 112b encounters holes (or electrons) injected through the second conductive type AlGaN-based semiconductor layer 116 and light is emitted by a band gap difference of an energy band according to a formative material of the active layer 114.

The active layer 114 may be composed of a compound semiconductor. The active layer 114 may be implemented as at least one of Group II-IV and Group III-V compound semiconductors.

The active layer 114 may include a quantum well and a quantum wall. When the active layer 114 is implemented as an MQW structure, the quantum well and the quantum wall may be alternately disposed. The quantum well and the quantum wall may be disposed with a semiconductor material having an empirical formula of $In_xAl_yGa_{1-x-y}N$ ($0 \leq x \leq 1$, $0 \leq y \leq 1$, $0 \leq x+y \leq 1$) respectively or may be formed as any one or more pairs of structures of AlGaN/GaN, AlGaN/AlGaN, InGaN/GaN, InGaN/InGaN, InAlGaN/GaN, GaAs/AlGaAs, InGaAs/AlGaAs, GaP/AlGaP, and InGaP/AlGaP, but are not limited thereto.

The second conductive type AlGaN-based semiconductor layer 116 may be implemented as a semiconductor compound, for example, a compound semiconductor such as Group II-IV and Group III-V, and may be doped with a second conductive type dopant. For example, the second conductive type AlGaN-based semiconductor layer 116 may include a semiconductor material having an empirical formula of $Al_pGa_{1-p}N$ ($0 \leq p \leq 1$). When the second conductive type AlGaN-based semiconductor layer 116 is a p-type semiconductor layer, the second conductive type dopant may include Mg, Zn, Ca, Sr, or Ba as a p-type dopant.

Although the first conductive type AlGaN-based first semiconductor layer 112a and the first conductive type AlGaN-based second semiconductor layer 112b are referred to as the n-type semiconductor layer and the second conductive type AlGaN-based semiconductor layer 116 is referred to as the p-type semiconductor layer, the first conductive type AlGaN-based first semiconductor layer 112a and the first conductive type AlGaN-based second semiconductor layer 112b may be formed as the p-type semiconductor layer, the second conductive type AlGaN-based semiconductor layer 116 may be formed as the n-type semiconductor layer, and are not limited thereto. On the second conductive type AlGaN-based semiconductor layer 116, a semiconductor, for example, an n-type semiconductor layer (not shown) having a polarity opposite to that of the second conductive type may be formed. Accordingly, the light-emitting structure 110 may be implemented as any one structure of an n-p junction structure, a p-n junction structure, an n-p-n junction structure, and a p-n-p junction structure.

The contact layer 171 may be formed on the light-emitting structure 110. The contact layer 171 is formed on the second conductive type AlGaN-based semiconductor layer 116. The contact layer 171 may be in direct contact with the second conductive type AlGaN-based semiconductor layer 116. The contact layer 171 may be a conductive oxide, a conductive nitride, or a metal. For example, the contact layer 171 may include at least one of indium tin oxide (ITO), ITO nitride (ITON), indium zinc oxide (IZO), IZO nitride (IZON), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, In, Au, W, Al, Pt, Ag and Ti.

The reflective layer 173 may be formed between the contact layer 171 and the capping layer 175. The reflective layer 173 may be electrically connected to the contact layer 171 and the capping layer 175. The reflective layer 173 may include a function of reflecting light incident from the light-emitting structure 110. The reflective layer 173 may improve light extraction efficiency by reflecting to an outside light incident from the light-emitting structure 110. The reflective layer 173 may be a metal. For example, the reflective layer 173 may be a metal or an alloy including at least one of Ag, Ni, Al, Rh, Pd, Ir, Ru, Mg, Zn, Pt, Cu, Au and Hf. The reflective layer 173 may be formed in a single layer or multiple layers including the metal or the alloy and a transparent conductive material, such as ITO, IZO, IZTO, IAZO, IGZO, IGTO, AZO, or ATO.

The capping layer 175 may be formed on the reflective layer 173. The capping layer 175 may be in direct contact with a lower surface of the reflective layer 173. The capping layer 175 may be a conductive material. For example, the capping layer 175 may include at least one of Au, Cu, Ni, Ti, Ti—W, Cr, W, Pt, V, Fe, and Mo, and may be formed in a single layer or multiple layers. An edge of the capping layer 175 may be disposed further outward than that of the light-emitting structure 110.

Figure 6:
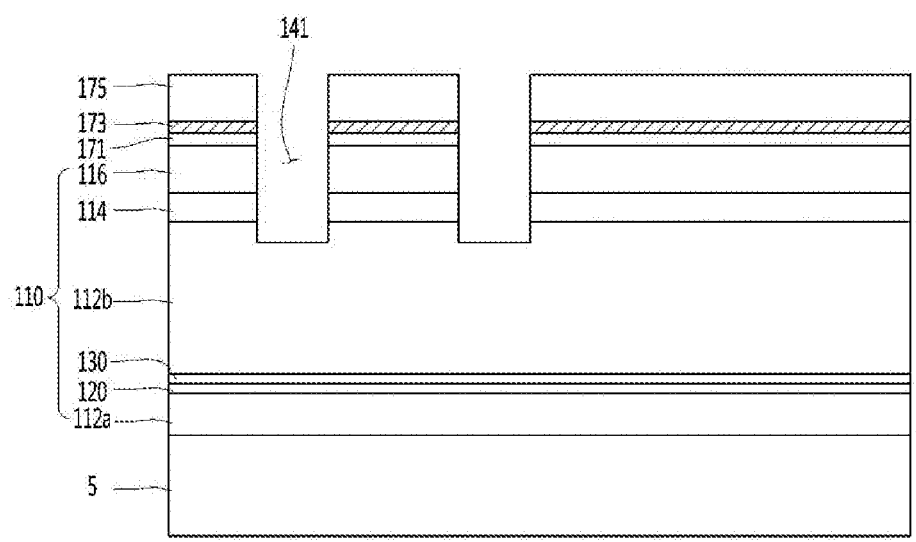

Referring to FIG. 6, a plurality of recesses 141 may be formed in the light-emitting structure 110. The recess 141 may be formed through an etching process. The recess 141 may expose the first conductive type AlGaN-based second semiconductor layer 112*b* to the outside. The recess 141 may expose side surfaces of the capping layer 175, the reflective layer 173 and the contact layer 171 to the outside and may expose side surfaces of the second conductive type AlGaN-based semiconductor layer 116, the active layer 114, and the first conductive type AlGaN-based second semiconductor layer 112*b* to the outside. A bottom surface of the recess 141 may be the first conductive type AlGaN-based second semiconductor layer 112*b*.

Figure 7:
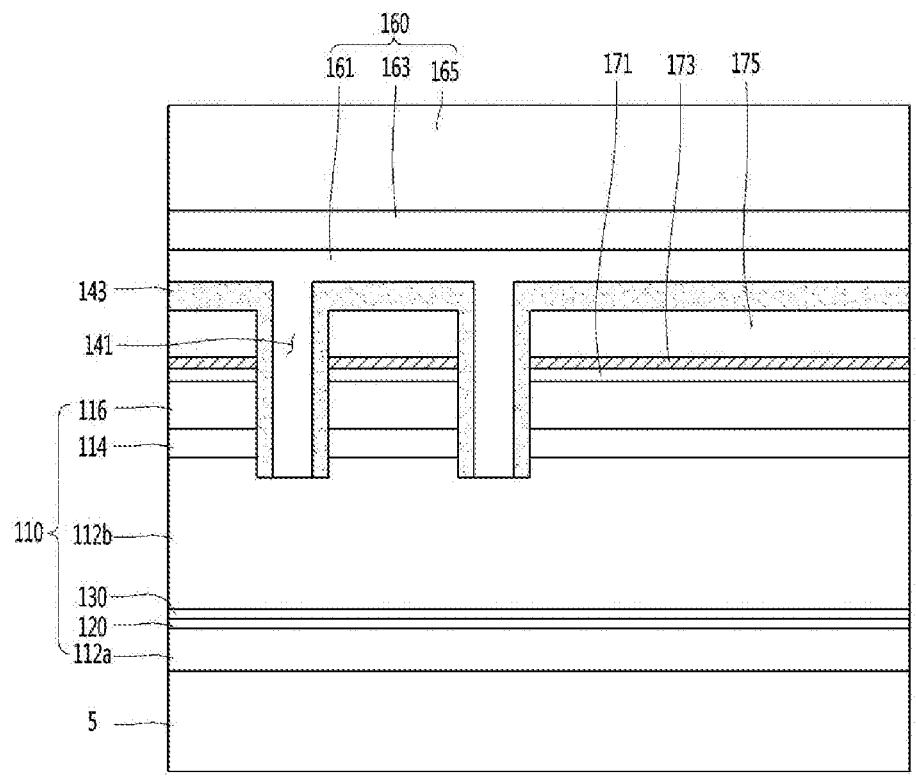

Referring to FIG. 7, an insulating layer 143 may be formed on the capping layer 175 and the recess 141, and the second electrode 160 may be formed on the insulating layer 143.

The insulating layer 143 may insulate the first electrode 170 and the second electrode 160 from each other. The insulating layer 143 may insulate the second electrode 160 and the second conductive type AlGaN-based semiconductor layer 116 from each other. The insulating layer 143 may be formed on a side portion of the recess 141. That is, the insulating layer 143 may insulate the capping layer 175, the reflective layer 173, the contact layer 171, the second conductive type AlGaN-based semiconductor layer 116, the active layer 114, and the first conductive type AlGaN-based second semiconductor layer 112*b*, which are exposed to the side portion of the recess 141. The insulating layer 143 may expose a part of the first conductive type AlGaN-based second semiconductor layer 112*b*, which is located on the bottom surface of the recess 141. The insulating layer 143 may be an oxide or a nitride. For example, the insulating layer 143 may be formed of at least one selected from the group consisting of $SiO_2$, $Si_xO_y$, $Si_3N_4$, $Si_xN_y$, $SiO_xN_y$, $Al_2O_3$, $TiO_2$, AlN, and the like.

The second electrode 160 may be formed on the insulating layer 143. The second electrode 160 may be formed to the first conductive type AlGaN-based second semiconductor layer 112*b*, which is exposed on the bottom surface of the recess 141. The second electrode 160 may be electrically connected to the first conductive type AlGaN-based second semiconductor layer 112*b*. The second electrode 160 may include a diffusion-barrier layer 161, a bonding layer 163, and a support member 165. The second electrode 160 may selectively include one or two of the diffusion-barrier layer 161, the bonding layer 163, and the support member 165. For example, the second electrode 160 may remove at least one of the diffusion-barrier layer 161 and the bonding layer 163.

The diffusion-barrier layer 161 may include a function of preventing diffusion of a material included in the bonding layer 163 to the first electrode 170. The diffusion-barrier layer 161 may be electrically connected to the bonding layer 163 and the support member 165. The diffusion-barrier layer 161 may include at least one of Cu, Ni, Ti, Ti—W, Cr, W, Pt, V, Fe, and Mo, and may be formed in a single layer or multiple layers.

The bonding layer 163 may be formed on the diffusion-barrier layer 161. The bonding layer 163 may be disposed between the diffusion-barrier layer 161 and the support member 165. The bonding layer 163 may include a barrier metal or a bonding metal. For example, the bonding layer 163 may include at least one of Ti, Au, Sn, Ni, Cr, Ga, In, Bi, Cu, Ag, Nb, Pd, and Ta, and may be formed in a single layer or multiple layers.

The support member 165 may be a metal or carrier substrate. For example, the support member 165 may be formed as at least any one of semiconductor substrates (e.g., Si, Ge, GaN, GaAs, ZnO, SiC, SiGe, etc.) into which Ti, Cr, Ni, Al, Pt, Au, W, Cu, Mo, Cu—W, or impurities are injected, and may be formed in a single layer or multiple layers.

Figure 8:
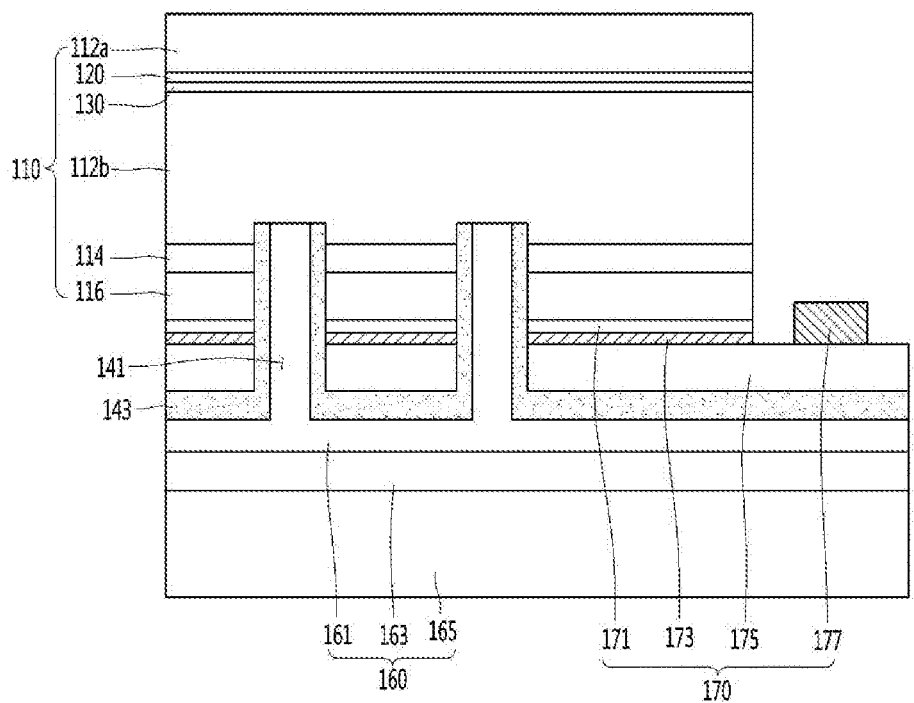
Figure 9:
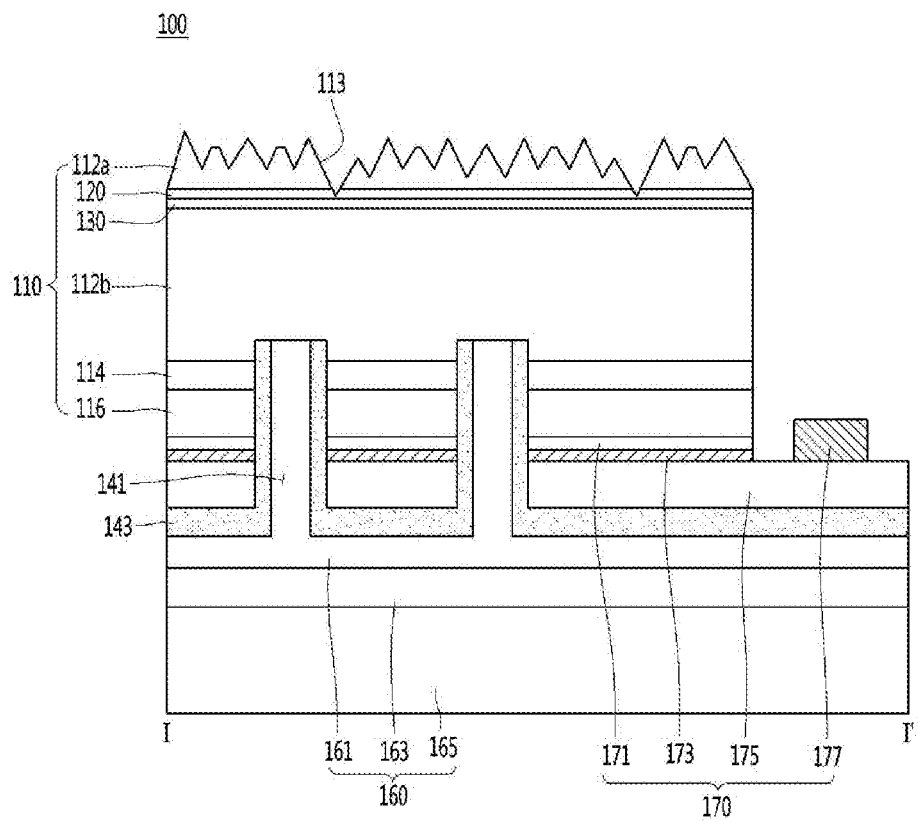

Referring to FIGS. 8 and 9, the substrate (5 of FIG. 7) may be removed from the light-emitting structure 110. A chemical etching method may be used for removing the substrate (5 in FIG. 7), but is not limited thereto.

A pad 177 may be formed on the capping layer 175, which is exposed from the light-emitting structure 110. Through an etching process, an upper surface of the capping layer 175 may be exposed from the light-emitting structure 110 and the exposed capping layer 175 may be located in at least one of edge regions of the light-emitting device, but is not limited thereto.

The pad 177 may be spaced apart from the light-emitting structure 110. The pad 177 may be disposed further outward than the light-emitting structure 110. The pad 177 may be formed on the capping layer 175, which is located further outward than the light-emitting structure 110. The pad 177 may include at least one of Cu, Ni, Ti, Ti—W, Cr, W, Pt, V, Fe and Mo and may be formed in a single layer or multiple layers.

On the light-emitting structure 110, a light extraction pattern 113 configured to improve the light extraction efficiency may be formed. The light extraction pattern 113 may be formed by a method such as PEC, but is not limited thereto. The light extraction pattern 113 may be formed to have a regular shape and arrangement, and may be formed to have an irregular shape and arrangement.

The light extraction pattern 113 may refract light generated from the active layer 114 to the outside, so that the light extraction efficiency may be improved.

In the ultraviolet light-emitting device 100 of an embodiment, the etching-blocking layer 120 may be formed between the first conductive type AlGaN-based first semiconductor layer 112*a* and the first conductive type AlGaN-based second semiconductor layer 112*b* to limit the depth of the light extraction pattern 113 to the etching-blocking layer 120, and thus the reduction in yield due to a short circuit in the first conductive type AlGaN-based second semiconductor layer 112*b* may be improved.

In addition, in the ultraviolet light-emitting device of an embodiment, by the dislocation blocking effect due to the etching-blocking layer 120 including the AlN 120*a* and the first conductive type AlGaN-based third semiconductor layer 120b, which are alternately formed in five or more pairs, the crystallinity of the light-emitting structure 110 may be improved.

In the ultraviolet light-emitting device 100 of an embodiment, the electron spreading layer 130 may be disposed between the etching-blocking layer 120 and the first conductive type AlGaN-based second semiconductor layer 112b, and thus the electron spreading effect may be improved.

In addition, in the ultraviolet light-emitting device 100 of an embodiment, since the electron spreading layer 130 formed at a higher temperature than that of the etching-blocking layer 120 is formed after the etching-blocking layer 120 is formed, a defect caused by the etching-blocking layer 120 may be blocked from proceeding to the first conductive type AlGaN-based second semiconductor layer 112b, and thus the crystallinity of the light-emitting structure may be improved.

Figure 10:
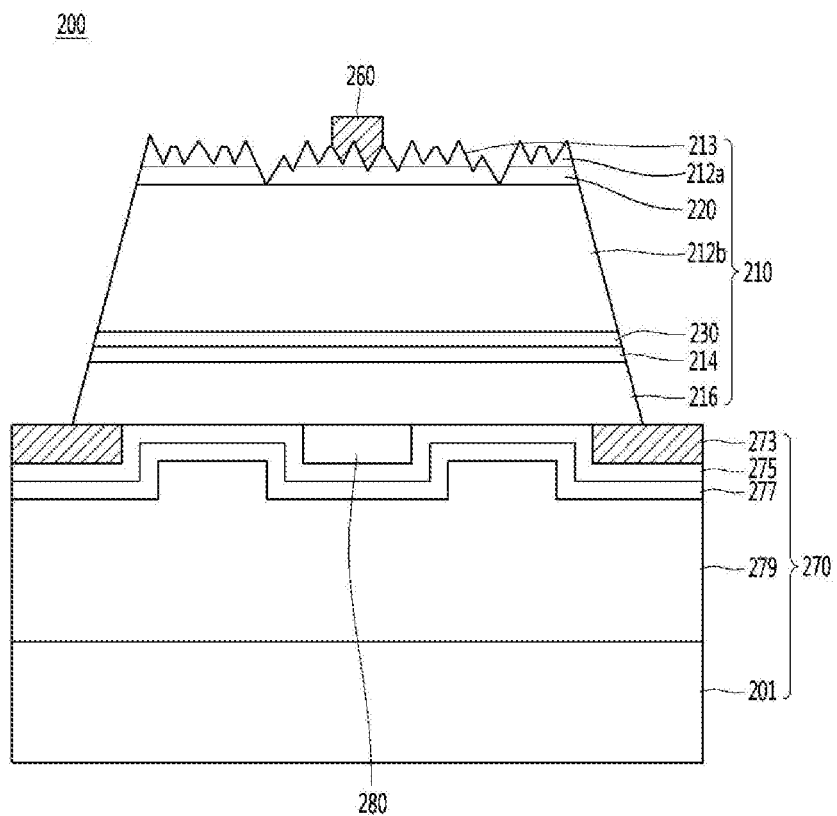
FIG. 10 is a cross-sectional view illustrating an ultraviolet light-emitting device according to another embodiment.
Figure 11:
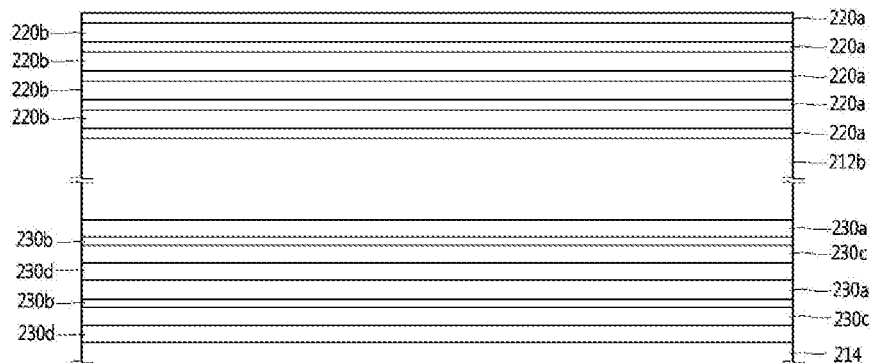
FIG. 11 is a cross-sectional view illustrating an etching-blocking layer and an electron spreading layer according to another embodiment.

FIG. 10 is a cross-sectional view illustrating an ultraviolet light-emitting device according to another embodiment, and FIG. 11 is a cross-sectional view illustrating an etching-blocking layer and an electron spreading layer according to another embodiment.

As shown in FIG. 10 and FIG. 11, a ultraviolet light-emitting device 200 according to another embodiment may include a first electrode 260 disposed on an upper portion of a light-emitting structure 210, and a second electrode 270 disposed on a lower portion of the light-emitting structure 210. In the ultraviolet light-emitting device 200 according to another embodiment, an electron spreading layer 230 may be disposed between a first conductive type GaN-based second semiconductor layer 212b and an active layer 214.

The light-emitting structure 210 may include a first conductive type GaN-based first semiconductor layer 212a, an etching-blocking layer 220, a first conductive type GaN-based second semiconductor layer 212b, an electron spreading layer 230, an active layer 214, and a second conductive type GaN-based semiconductor layer 216.

The first conductive type GaN-based first semiconductor layer 212a and the first conductive type GaN-based second semiconductor layer 212b may implemented as a semiconductor compound, for example, a semiconductor compound such as Group II-IV and Group III-V, and a first conductive type dopant may be doped. When the first conductive type GaN-based first semiconductor layer 212a and the first conductive type GaN-based second semiconductor layer 212b are an n-type semiconductor layer, as an n-type dopant, the first conductive type GaN-based first semiconductor layer 212a and the first conductive type GaN-based second semiconductor layer 212b may include Si, Ge, Sn, Se, and Te, but are not limited thereto.

The first conductive type GaN-based first semiconductor layer 212a may include a light extraction pattern 213 for improving light extraction efficiency. The light extraction pattern 213 may be formed by a method such as PEC, but is not limited thereto. The light extraction pattern 213 may be formed to have a regular shape and arrangement, and may be formed to have an irregular shape and arrangement. The light extraction pattern 213 may refract to an outside light generated from the active layer 214 and totally reflected from an upper surface of the first conductive type GaN-based first semiconductor layer 212a to be reabsorbed, thereby improving the light extraction efficiency.

The etching-blocking layer 220 may limit a formative depth of the light extraction pattern 213. For example, the etching-blocking layer 220 may include an AlN 220a and a first conductive type AlGaN-based first semiconductor layer 220b. Here, the AlN 220a may include a first conductive type dopant, but is not limited thereto. Al of the AlN 220a has larger bonding energy than Ga of the first conductive type GaN-based first semiconductor layer 212a. As a result, an etching rate of the etching-blocking layer 220 may be slower than that of the first conductive type GaN-based first semiconductor layer 212a. Accordingly, it is difficult for the light extraction pattern 213 to have a depth penetrating through the etching-blocking layer 220 by a slow etching rate of the etching-blocking layer 220 while the light extraction pattern 213 is formed by etching the first conductive type GaN-based second semiconductor layer 212b. The etching-blocking layer 220 may be formed such that the AlN 220a and the first conductive type AlGaN-based first semiconductor layer 220b are alternated in five or more pairs. For example, the etching-blocking layer 220 may be formed such that the AlN 220a and the first conductive type AlGaN-based first semiconductor layer 220b are alternated in 5 to 15 pairs. When the AlN 220a and the first conductive type AlGaN-based first semiconductor layer 220b are alternated in less than 5 pairs, an etching-blocking effect may be deteriorated. When the AlN 220a and the first conductive type AlGaN-based first semiconductor layer 220b are alternated in more than 15 pairs, crystallinity may be deteriorated due to a difference in lattice constant.

A thickness of the AlN 220a may be 0.5 nm or more. For example, the thickness of the AlN 220a may be 0.5 nm to 3 nm. When the thickness of the AlN 220a is less than 0.5 nm, the etching-blocking effect may be deteriorated. When the thickness of the AlN 220a exceeds 3 nm, the crystallinity may be deteriorated by the AlN 220a in which a lattice is small, and carrier injection efficiency may be deteriorated.

A thickness of the first conductive type AlGaN-based first semiconductor layer 220b may be 1 nm or more. For example, the thickness of the first conductive type AlGaN-based first semiconductor layer 220b may be 1 to 5 nm. When the thickness of the first conductive type AlGaN-based first semiconductor layer 220b is less than 1 nm, an electron spreading effect may be deteriorated, and when the thickness of the first conductive type AlGaN-based first semiconductor layer 220b exceeds 5 nm, the crystallinity may be deteriorated. The first conductive type AlGaN-based first semiconductor layer 220b may be $Al_cGa_{1-c}N$ ($0.4 \leq c \leq 0.8$). When an aluminum (Al) composition (c) is less than 0.4, the etching-blocking effect may be deteriorated, and when the aluminum (Al) composition (c) exceeds 0.8, the crystallinity may be deteriorated.

A total thickness of the etching-blocking layer 220 may be 15 to 25 nm. When the thickness of the etching-blocking layer 220 is less than 15 nm, the electron spreading effect may be deteriorated, and when the thickness of the etching-blocking layer 220 exceeds 25 nm, the crystallinity may be deteriorated.

In the ultraviolet light-emitting device 200 of another embodiment, since the etching-blocking layer 220 is formed between the first conductive type GaN-based first semiconductor layer 212a and the first conductive type GaN-based second semiconductor layer 212b to limit a depth of the light extraction pattern 213, over-etching may be improved. Accordingly, the ultraviolet light-emitting device of the embodiment may improve a reduction in yield due to a short circuit.

In addition, the ultraviolet light-emitting device 200 of another embodiment may include a dislocation blocking effect by the AlN 220a and the first conductive type AlGaN-based first semiconductor layer 220b which are alternately formed in five or more pairs.

The ultraviolet light-emitting device 200 of the embodiment may include an electron spreading layer 230 under the first conductive type GaN-based second semiconductor layer 212b. The electron spreading layer 230 may be formed at a higher temperature than that of the etching-blocking layer 220. The electron spreading layer 230 may be grown at a higher temperature than that of the etching-blocking layer 220 to improve defects.

The electron spreading layer 230 may be disposed between the active layer 214 and the first conductive type GaN-based second semiconductor layer 212b. The electron spreading layer 230 may improve crystal defects and improve electron spreading simultaneously. For example, the electron spreading layer 230 may include a first conductive type GaN-based third semiconductor layer 230a, an undoped AlN 230b, a first conductive type AlGaN-based second semiconductor layer 230c, and an undoped GaN-based semiconductor layer 230d. The electron spreading layer 230 may generate an internal field by piezo-electric due to a difference in lattice constant between the first conductive type GaN-based third semiconductor layer 230a and the undoped AlN 230b and may induce electron spreading at an interface between the first conductive type GaN-based third semiconductor layer 230a and the undoped AlN 230b. The electron spreading layer 230 may be formed such that the first conductive type GaN-based third semiconductor layer 230a, the undoped AlN 230b, the first conductive type AlGaN-based second semiconductor layer 230c, and the undoped GaN-based semiconductor layer 230d are alternated in two pairs or more. For example, the electron spreading layer 230 may be formed such that the first conductive type GaN-based third semiconductor layer 230a, the undoped AlN 230b, the first conductive type AlGaN-based second semiconductor layer 230c, and the undoped GaN-based semiconductor layer 230d are alternated in two to four pairs. When the electron spreading layer 230 is formed such that the first conductive type GaN-based third semiconductor layer 230a, the undoped AlN 230b, the first conductive type AlGaN-based second semiconductor layer 230c, and the undoped GaN-based semiconductor layer 230d are alternated in less than two pairs, the electron spreading effect may be deteriorated. When the electron spreading layer 230 is formed such that the first conductive type GaN-based third semiconductor layer 230a, the undoped AlN 230b, the first conductive type AlGaN-based second semiconductor layer 230c, and the undoped GaN-based semiconductor layer 230d are alternated in more than four pairs, the crystallinity may be deteriorated.

The first conductive type GaN-based third semiconductor layer 230a may be disposed between the first conductive type GaN-based second semiconductor layer 212b and the undoped AlN 230b. A thickness of the first conductive type GaN-based third semiconductor layer 230a may be 5 nm or more. For example, the thickness of the first conductive type GaN-based third semiconductor layer 230a may be 5 to 20 nm. When the thickness of the first conductive type GaN-based third semiconductor layer 230a is less than 5 nm, the electron spreading effect may be deteriorated. When the thickness of the first conductive type GaN-based third semiconductor layer 230a exceeds 20 nm, the total thickness of the etching-blocking layer 220 may become thick. Here, the first conductive type GaN-based third semiconductor layer 230a may include a first conductive type dopant in the embodiment, but is not limited thereto, and the first conductive type GaN-based third semiconductor layer 230a may be an undoped GaN-based semiconductor layer.

The undoped AlN 230b may be disposed between the first conductive type GaN-based third semiconductor layer 230a and the first conductive type AlGaN-based second semiconductor layer 230c. The undoped AlN 230b may have larger band gap energy than that of the first conductive type GaN-based third semiconductor layer 230a. A thickness of the undoped AlN 230b may be 0.5 nm or more. For example, the thickness of the undoped AlN 230b may be 0.5 to 1.5 nm. When the thickness of the undoped AlN 230b is less than 0.5 nm, the electron spreading effect may be deteriorated. When the thickness of the undoped AlN 230b exceeds 1.5 nm, the crystallinity may be deteriorated.

The first conductive type AlGaN-based second semiconductor layer 230c may be disposed between the undoped AlN 230b and the undoped GaN-based semiconductor layer 230d, and an Al composition may be gradually lowered as toward the undoped GaN-based semiconductor layer 230d. The Al composition of the first conductive type AlGaN-based second semiconductor layer 230c gradually decreases as toward the undoped GaN-based semiconductor layer 230d from the undoped AlN 230b, and thus a function of improving the crystallinity may be included. The first conductive type AlGaN-based second semiconductor layer 230c may be $Al_dGa_{1-d}N$ (0≤d≤0.35). That is, an Al composition (d) of the first conductive type AlGaN-based second semiconductor layer 230c gradually decreases as toward the undoped GaN-based semiconductor layer 230d, and may be zero in a region which is contact the undoped GaN-based semiconductor layer 230d. When the aluminum (Al) composition (d) exceeds 0.35, the crystallinity may be deteriorated. A thickness of the first conductive type AlGaN-based second semiconductor layer 230c may be 15 nm or more. For example, the thickness of the first conductive type AlGaN-based second semiconductor layer 230c may be 15 to 25 nm. When the thickness of the first conductive type AlGaN-based second semiconductor layer 230c is less than 15 nm, the electron spreading effect may be deteriorated. When the thickness of the first conductive type AlGaN-based second semiconductor layer 230c exceeds 25 nm, the crystallinity may be deteriorated.

The undoped GaN-based semiconductor layer 230d may be disposed between the first conductive type AlGaN-based second semiconductor layer 230c and the first conductive type GaN-based third semiconductor layer 230a. The undoped GaN-based semiconductor layer 230d may be disposed between the first conductive type AlGaN-based second semiconductor layer 230c and the active layer 214. A thickness of the undoped GaN-based semiconductor layer 230d may be 3 nm or more. For example, the thickness of the undoped GaN-based semiconductor layer 230d may be 3 to 10 nm. When the thickness of the undoped GaN-based semiconductor layer 230d is less than 3 nm, the electron spreading effect may be deteriorated. When the thickness of the undoped GaN-based semiconductor layer 230d is more than 10 nm, an operating voltage Vf may increase. Here, the undoped GaN-based semiconductor layer 230d may be omitted.

In the ultraviolet light-emitting device 200 of another embodiment, the electron spreading layer 230 may be disposed between the active layer 214 and the first conductive type GaN-based second semiconductor layer 212b, and thus the electron spreading effect may be improved.

In addition, the ultraviolet light-emitting device 200 of another embodiment may improve a defect caused by the etching-blocking layer 220 by the electron spreading layer 230, which is formed at a higher temperature than that of the etching-blocking layer 220.

The active layer 214 may be formed as at least one of a single quantum well structure, a multi-quantum well (MQW) structure, a quantum-wire structure, and a quantum dot structure.

The active layer 214 is a layer at which electrons (or holes) injected through the first conductive type GaN-based second semiconductor layer 212b encounters holes (or electrons) injected through the second conductive type GaN-based semiconductor layer 216 and light is emitted by a band gap difference of an energy band according to a formative material of the active layer 214.

The active layer 214 may be composed of a compound semiconductor. The active layer 214, for example, may be implemented as at least one of Group II-IV and Group III-V compound semiconductors.

The active layer 214 may include a quantum well and a quantum wall. When the active layer 214 is implemented as an MQW structure, the quantum well and the quantum wall may be alternately disposed. The quantum well and the quantum wall may be disposed with a semiconductor material having an empirical formula of $In_xAl_yGa_{1-x-y}N$ ($0 \leq x \leq 1$, $0 \leq y \leq 1$, $0 \leq x+y \leq 1$) respectively or may be formed as any one or more pairs of structures of AlGaN/GaN, AlGaN/AlGaN, InGaN/GaN, InGaN/InGaN, InAlGaN/GaN, GaAs/AlGaAs, InGaAs/Al GaAs, GaP/AlGaP, and InGaP/AlGaP, but are not limited thereto.

The second conductive type GaN-based semiconductor layer 216 may be implemented as a semiconductor compound, for example, a compound semiconductor such as Group II-IV and Group III-V, and may be doped with a second conductive type dopant. When the second conductive type GaN-based semiconductor layer 216 is a p-type semiconductor layer, the second conductive type dopant may include Mg, Zn, Ca, Sr, Ba, etc. as a p-type dopant.

Although the first conductive type GaN-based first semiconductor layer 212a and the first conductive type GaN-based second semiconductor layer 212b are referred to as the n-type semiconductor layer and the second conductive type GaN-based semiconductor layer 216 is referred to as the p-type semiconductor layer, the first conductive type GaN-based first semiconductor layer 212a and the first conductive type GaN-based second semiconductor layer 212b may be formed as the p-type semiconductor layer, the second conductive type GaN-based semiconductor layer 216 may be formed as the n-type semiconductor layer, and are not limited thereto. A semiconductor having a polarity opposite to that of the second conductive type, for example, an n-type semiconductor layer (not shown) may be formed on the second conductive type GaN-based semiconductor layer 216. Accordingly, the light-emitting structure 210 may be implemented as any one structure of an n-p junction structure, a p-n junction structure, an n-p-n junction structure, and a p-n-p junction structure.

The first electrode 260 may be disposed on the first conductive type GaN-based first semiconductor layer 212a. The first electrode 260 may be electrically connected to the first conductive type GaN-based first semiconductor layer 212a, may include at least one of Cu, Ni, Ti, Ti—W, Cr, W, Pt, V, and Mo materials, and may be formed in a single layer or multiple layers.

In another embodiment, an electron blocking layer 280 may be disposed under the light-emitting structure 210. The electron blocking layer 280 may include at least one of $SiO_2$, $SiO_x$, $SiO_xN_y$, $Si_3N_4$, $Al_2O_3$, and $TiO_2$ and at least one of the electron blocking layer 280 may be formed between the light-emitting structure 210 and the second electrode 270.

The electron blocking layer 280 may be disposed to correspond to a thickness direction of the first electrode 260 disposed on the light-emitting structure 210 and the light-emitting structure 210. The electron blocking layer 280 may block a current which is supplied from the second electrode 270 and diffuse the current to another path to improve concentration of a current which is concentrated directly under the first electrode 260.

The second electrode 270 may include a channel layer 273, a contact layer 275, a reflective layer 277, a bonding layer 279, and a support member 201.

The channel layer 273 is formed along a bottom surface of the second conductive type GaN-based semiconductor layer 216, and may be formed in a ring shape, a loop shape, or a frame shape. The channel layer 273 may include at least one of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$. An inner side portion of the channel layer 273 may be disposed under the second conductive type GaN-based semiconductor layer 216 and an outer side portion thereof may be disposed further outward than a side surface of the light-emitting structure 210.

The contact layer 275 may be formed by stacking a single metal, a metal alloy, a metal oxide, or the like in multiple layers so as to efficiently perform carrier injection. The contact layer 275 may be formed of a material excellent in electrical contact with a semiconductor. For example, the contact layer 275 may be formed to include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf, but is not limited thereto.

The reflective layer 277 may be located under the contact layer 275. The reflective layer 277 may be formed of a material having excellent reflectivity and excellent electrical contact. For example, the reflective layer 277 may be formed of a metal or an alloy including at least one of Ag, Ni, Al, Rh, Pd, Ir, Ru, Mg, Zn, Pt, Au, and Hf In addition, the reflective layer 277 may be formed in a single layer or multiple layers by using the metal or alloy and a light-transmitting conductive material such as IZO, IZTO, IAZO, IGZO, IGTO, AZO, or ATO, and for example, may be stacked with IZO/Ni, AZO/Ag, IZO/Ag/Ni, AZO/Ag/Ni or the like.

The bonding layer 279 may be disposed under the reflective layer 277 and may be used as a barrier metal or a bonding metal, and for example, a material thereof, for example, may include at least one of Ti, Au, Sn, Ni, Cr, Ga, In, Bi, Cu, Ag, and Ta and selective alloys.

The support member 201 may be disposed under the bonding layer 279 and may be formed of a conductive material such as copper (Cu), gold (Au), nickel (Ni), molybdenum (Mo), copper-tungsten (Cu—W), and carrier wafers such as Si, Ge, GaAs, ZnO, and SiC. As another example, the support member 201 may be implemented as a conductive sheet.

In the ultraviolet light-emitting device 200 of another embodiment, since the etching-blocking layer 220 is formed between the first conductive type GaN-based first semiconductor layer 212a and the first conductive type GaN-based second semiconductor layer 212b so that the depth of the light extraction pattern 213 is limited, over-etching may be improved. Accordingly, the ultraviolet light-emitting device of the embodiment may improve the reduction in yield due to a short circuit.

In addition, the ultraviolet light-emitting device 200 according to another embodiment may include the dislocation blocking effect by the etching-blocking layer 220 in which the AlN 220a and the first conductive type AlGaN-based first semiconductor layer 220b are alternately formed in five or more pairs.

In the ultraviolet light-emitting device 200 of another embodiment, the electron spreading layer 230 may be disposed between the active layer 214 and the first conductive type GaN-based second semiconductor layer 212b, and thus the electron spreading effect may be improved.

In addition, the ultraviolet light-emitting device 200 of another embodiment may improve the defects caused by the etching-blocking layer 220 by the electron spreading layer 230 which is formed at a higher temperature than that of the etching-blocking layer 220.

Figure 12:
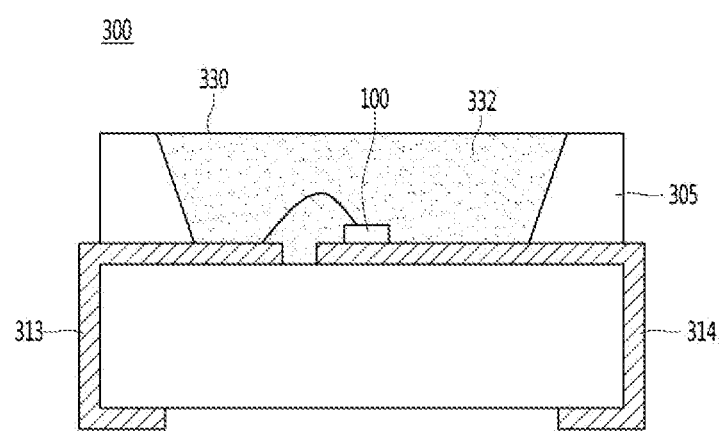
FIG. 12 is a cross-sectional view illustrating a light-emitting device package according to an embodiment.

FIG. 12 is a cross-sectional view illustrating a light-emitting device package according to an embodiment.

A light-emitting device package 300 according to an embodiment includes a package body 305, a first lead electrode 313 and a second lead electrode 314 provided on the package body 305, an ultraviolet light-emitting device 100 mounted on the package body 305 and electrically connected to the first lead electrode 313 and the second lead electrode 314, and a molding member 330 surrounding the ultraviolet light-emitting device 100, The first lead electrode 313 and the second lead electrode 314 are electrically separated from each other and perform a function to provide power to the ultraviolet light-emitting device 100. In addition, the first lead electrode 313 and the second lead electrode 314 may include a function of reflecting light emitted from the ultraviolet light-emitting device 100 to increase light efficiency, and may include a function of discharging heat generated from the ultraviolet light-emitting device 100 to the outside.

The ultraviolet light-emitting device 100 may be electrically connected with the first lead electrode 313 or the second lead electrode 314 in any one of a wire method, a flip chip method and a die bonding method.

The ultraviolet light-emitting device 100 may be an ultraviolet light-emitting device according to one embodiment, but may be an ultraviolet light-emitting device according to another embodiment.

The molding member 330 may include a phosphor 332 to form a light-emitting device package of white light, but is not limited thereto.

An upper surface of the molding member 330 may be flat, concave or convex, but is not limited thereto.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it would be construed that contents related to such a combination and such a modification are included in the scope of the present invention.

Embodiments are mostly described above. However, they are only examples and do not limit the present invention. A person skilled in the art may appreciate that several variations and applications not presented above may be made without departing from the essential characteristic of embodiments. For example, each component particularly represented in the embodiments may be varied. In addition, it should be construed that differences related to such a variation and such an application are included in the scope of the present invention defined in the following claims.

The invention claimed is:

1. An ultraviolet light-emitting device comprising:
   a support member;
   a light-emitting structure on the support member, the light-emitting structure having a second conductive type semiconductor layer and a first conductive type semiconductor layer, an active layer disposed between the first conductive type semiconductor layer and the second conductive type semiconductor layer, and a plurality of recesses that penetrate the second conductive type semiconductor layer and the active layer and expose a part of a region of the first conductive type semiconductor layer;
   a first electrode disposed between the support member and the light-emitting structure and is electrically connected to the second conductive type semiconductor layer,
   a second electrode disposed under the first electrode and is electrically connected to the exposed region of the first conductive type semiconductor layer,
   wherein the first conductive type semiconductor layer includes a first conductive type second semiconductor layer disposed on the active layer, a first conductive type first semiconductor layer disposed on the first conductive type second semiconductor layer, and an etching-blocking layer disposed between the first conductive type first semiconductor layer and the first conductive type second semiconductor layer,
   wherein the first conductive type first semiconductor layer includes a light extraction pattern,
   wherein an electron spreading layer is disposed between the etching-blocking layer and the first conductive type second semiconductor layer,
   wherein the electron spreading layer includes a first conductive AlGaN based fourth semiconductor layer, an undoped AlN layer, a first conductive AlGaN based fifth semiconductor layer, and an undoped AlGaN based semiconductor layer,
   wherein the first conductive AlGaN based fourth semiconductor layer is disposed between the etching-blocking layer and an undoped AlN layer,
   wherein the undoped AlN layer is disposed between the first conductive AlGaN based fourth semiconductor layer and a first conductive AlGaN based fifth semiconductor layer,
   wherein the first conductive AlGaN based fifth semiconductor layer is disposed between the undoped AlN layer and an undoped AlGaN based semiconductor layer,
   wherein the undoped AlGaN based semiconductor layer is disposed between the first conductive AlGaN based fifth semiconductor layer and the first conductive type second semiconductor layer,
   wherein the undoped AlN layer has larger bandgap energy than that of the first conductive type AlGaN-based fourth semiconductor layer, the first conductive AlGaN based fifth semiconductor layer and the undoped AlGaN based semiconductor layer,
   wherein a bandgap energy of the first conductive AlGaN based fifth semiconductor layer gradually decreases toward the undoped AlGaN-based semiconductor layer from the undoped AlN layer, wherein a thickness of the undoped AlN layer is thinner than a thickness of the undoped AlGaN-based semiconductor layer, wherein the thickness of the undoped AlGaN-based semiconductor layer is thinner than a thickness of the first conductive AlGaN based fifth semiconductor layer, wherein the second electrode includes a contact portion disposed in each of the plurality of recesses and directly makes contact with the first conductive type second semiconductor layer, wherein the etching-blocking layer and the electron spreading layer are spaced apart from the contact portion of the second electrode by distance in a vertical direction.

2. The ultraviolet light-emitting device of claim 1, wherein the first conductive type first semiconductor layer, the first conductive type second semiconductor layer, and the second conductive type semiconductor layer are composed of an AlGaN-series.

3. The ultraviolet light-emitting device of claim 2, wherein the first conductive type AlGaN-based fifth semiconductor layer is $Al_bGa_{1-b}N$ ($0.25 \leq b \leq 0.35$), and wherein an Al composition of the first conductive type AlGaN-based fifth semiconductor layer gradually decreases as toward the undoped AlGaN-based semiconductor layer from the undoped AlN layer.

4. The ultraviolet light-emitting device of claim 2, wherein a thickness of the first conductive type AlGaN-based fifth semiconductor layer is 15 to 25 nm.

5. The ultraviolet light-emitting device of claim 2, wherein the first electrode includes a contact layer disposed under the second conductive type semiconductor layer, a reflective layer disposed under the contact layer, a capping layer disposed under the reflective layer, and a pad disposed on the capping layer which is located further outward than the light-emitting structure, and wherein the second electrode includes the support member, a diffusion-barrier layer disposed on the support member and includes the contact portion; and a bonding layer disposed between the diffusion-barrier layer and the support member.

6. The ultraviolet light-emitting device of claim 5, wherein the distance between the contact portion of the diffusion-barrier layer, which is contact with the first conductive type second semiconductor layer, and the electron spreading layer is 800 to 1200 nm.

7. The ultraviolet light-emitting device of claim 2, wherein the electron spreading layer and the etching-blocking layer are in contact with each other.

8. The ultraviolet light-emitting device of claim 7, wherein the etching-blocking layer is formed such that an AlN and a first conductive type AlGaN-based third semiconductor layer are alternated in five or more pairs.

9. The ultraviolet light-emitting device of claim 2, wherein a thickness of the first conductive type AlGaN-based fourth semiconductor layer is 5 nm to 20 nm.

10. The ultraviolet light-emitting device of claim 8, wherein a total thickness of the etching-blocking layer is 15 nm to 25 nm.

11. The ultraviolet light-emitting device of claim 8, wherein the first conductive type AlGaN-based third semiconductor layer is $Al_aGa_{1-a}N$ ($0.4 \leq a \leq 0.8$).

12. The ultraviolet light-emitting device of claim 10, wherein a thickness of the AlN is 0.5 nm to 3 nm.

13. The ultraviolet light-emitting device of claim 12, wherein a thickness of the first conductive type AlGaN-based first semiconductor layer is 1 nm to 5 nm.

14. A light-emitting device package device comprising:
a package body;
a first lead electrode and a second lead electrode provided on the package body; and
an ultraviolet light-emitting device mounted on the package body and electrically connected to the first lead electrode and the second lead electrode,
wherein the ultraviolet light-emitting device comprises:
a support member;
a light-emitting structure on the support member, the light-emitting structure having a second conductive type semiconductor layer and a first conductive type semiconductor layer, an active layer disposed between the first conductive type semiconductor layer and the second conductive type semiconductor layer, and a plurality of recesses that penetrate the second conductive type semiconductor layer and the active layer and expose a part of a region of the first conductive type semiconductor layer;
a first electrode disposed between the support member and the light-emitting structure and is electrically connected to the second conductive type semiconductor layer;
a second electrode disposed under the first electrode and is electrically connected to the exposed region of the first conductive type semiconductor layer,
wherein the first conductive type semiconductor layer includes a first conductive type second semiconductor layer disposed on the active layer, a first conductive type first semiconductor layer disposed on the first conductive type second semiconductor layer, and an etching-blocking layer disposed between the first conductive type first semiconductor layer and the first conductive type second semiconductor layer,
wherein the first conductive type first semiconductor layer includes a light extraction pattern,
wherein an electron spreading layer is disposed between the etching-blocking layer and the first conductive type second semiconductor layer,
wherein the electron spreading layer includes a first conductive AlGaN based fourth semiconductor layer, an undoped AlN layer, a first conductive AlGaN based fifth semiconductor layer, and an undoped AlGaN based semiconductor layer,
wherein the first conductive AlGaN based fourth semiconductor layer is disposed between the etching-blocking layer and an undoped AlN layer,
wherein the undoped AlN layer is disposed between the first conductive AlGaN based fourth semiconductor layer and a first conductive AlGaN based fifth semiconductor layer,
wherein the first conductive AlGaN based fifth semiconductor layer is disposed between the undoped AlN layer and an undoped AlGaN based semiconductor layer,
wherein the undoped AlGaN based semiconductor layer is disposed between the first conductive AlGaN based fifth semiconductor layer and the first conductive type second semiconductor layer,
wherein the undoped AlN layer has larger bandgap energy than that of the first conductive type AlGaN-based fourth semiconductor layer, the first conductive AlGaN based fifth semiconductor layer and the undoped AlGaN based semiconductor layer, wherein a bandgap energy of the first conductive AlGaN based fifth semiconductor layer gradually decreases toward the undoped AlGaN-based semiconductor layer from the undoped AlN layer,
wherein a thickness of the undoped AlN layer is thinner than a thickness of the undoped AlGaN-based semiconductor layer,
wherein the thickness of the undoped AlGaN-based semiconductor layer is thinner than a thickness of the first conductive AlGaN based fifth semiconductor layer,
wherein the second electrode includes a contact portion disposed in each of the plurality of recesses and directly makes contact with the first conductive type second semiconductor layer,
wherein the etching-blocking layer and the electron spreading layer are spaced apart from the contact portion of the second electrode by distance in a vertical direction.

\* \* \* \* \*